United States Patent
Seri et al.

(10) Patent No.: US 6,663,946 B2
(45) Date of Patent: Dec. 16, 2003

(54) MULTI-LAYER WIRING SUBSTRATE

(75) Inventors: Takuji Seri, Kokubu (JP); Katsura Hayashi, Kokubu (JP); Tadashi Nagasawa, Kokubu (JP); Kenji Kume, Kokubu (JP); Takahiro Matsunaga, Kokubu (JP); Isao Miyatani, Kokubu (JP)

(73) Assignee: Kyocera Corporation, Kyoto (JP)

( * ) Notice: Subject to any disclaimer, the term of this patent is extended or adjusted under 35 U.S.C. 154(b) by 4 days.

(21) Appl. No.: 10/091,114

(22) Filed: Feb. 28, 2002

(65) Prior Publication Data

US 2002/0172021 A1 Nov. 21, 2002

(30) Foreign Application Priority Data

| Feb. 28, 2001 | (JP) | P2001-053834 |
| Mar. 23, 2001 | (JP) | P2001-086037 |
| Apr. 24, 2001 | (JP) | P2001-126385 |
| May 30, 2001 | (JP) | P2001-161689 |
| Jul. 30, 2001 | (JP) | P2001-230643 |

(51) Int. Cl.⁷ .............................. B32B 9/00; H05K 1/00
(52) U.S. Cl. .................. 428/209; 428/216; 428/323; 428/422.8; 428/462; 428/515; 428/901; 174/250; 174/251; 174/257; 174/258
(58) Field of Search .......................... 428/209, 216, 428/323, 422.8, 462, 515, 901; 174/250, 251, 257, 258

(56) References Cited

FOREIGN PATENT DOCUMENTS

| JP | 8-97565 | 4/1996 |
| JP | 8-293579 | 11/1996 |
| JP | 11-340367 | 12/1999 |
| JP | 2000-269616 | 9/2000 |
| JP | 2000-277875 | 10/2000 |
| JP | 2000-277889 | 10/2000 |
| JP | 2000-340954 | 12/2000 |
| JP | 2000-349437 | * 12/2000 ............ H05K/3/46 |

OTHER PUBLICATIONS

Translation of JP–2000–349437 (No Date).*

*8–97565 correspond with the U.S. patent No. 5,719,354 (No Date).

* cited by examiner

Primary Examiner—Deborah Jones
Assistant Examiner—Ling Xu
(74) Attorney, Agent, or Firm—Hogan & Hartson

(57) ABSTRACT

An object of the invention is to satisfy all of a high-density wiring package, soldering thermal resistance, an insulating property and high-frequency transmission characteristics. The invention is a multi-layer wiring substrate having a lamination of a plurality of dielectric layers which are each provided with a wiring conductor made of a metallic foil on at least one of upper and bottom surfaces of the dielectric layer, the wiring conductors between which the dielectric layer is disposed being electrically connected with each other via a through conductor formed in the dielectric layer; on this occasion, the dielectric layers each individually are composed of a liquid crystal polymer layer and cladding layers made of a polyphenyleneether-type organic substance and formed on upper and bottom surfaces of the liquid crystal polymer layer.

20 Claims, 12 Drawing Sheets

MULTI-LAYER WIRING SUBSTRATE

BACKGROUND OF THE INVENTION

1. Field of the Invention

The present invention relates to multi-layer wiring substrates for use in electronic instruments such as various types of AV instruments, home electric appliances, communication instruments, computers and peripheral instruments thereof and, particularly, to a multi-layer wiring substrate in which a liquid crystal polymer layer is used as a portion of a dielectric layer.

2. Description of Related Art

Heretofore, a multi-layer wiring substrate for forming a mixed integrated circuit in which a predetermined electronic circuit is constructed by mounting thereon a multiple of active components such as a semiconductor element and the like, and passive components such as a capacitor element, a resistor element and the like have been formed by forming a vertical through-hole by means of a drill on a dielectric layer made up by impregnating an epoxy resin in glass cloth, forming a plurality of wiring conductors on an inside of the thus-formed through-hole and on a surface of the dielectric layer to form a wiring substrate and, then, laminating a multiple of the thus-formed wiring substrate.

Ordinarily, a present-day electronic instrument, as is represented by a mobile communication instrument, is requested to be small in size, thin, and light in weight, to have a high performance, high functionality, a high quality and high reliability. For this reason, electronic components such as a mixed integrated circuit and the like to be mounted on such electronic instrument has come to be requested to be small in size and of a high-density package. In order to meet such a requirement for the high-density package, minuteness of the wiring conductor, thinness of the dielectric layer and minuteness of the through-hole have come to be required also for the multi-layer wiring substrate which constitutes the electronic component. For this reason, in recent years, in order to allow the through-hole to be minute, laser processing which enables minute processing than drill processing has come to be employed.

However, in the dielectric layer made up of impregnating the epoxy resin in the glass cloth, there is a difficulty in providing a hole in the glass cloth by a laser whereby there is a limitation on minuteness of the through-hole and, further, there is a problem that it is difficult to form the through-hole having a uniform pore diameter due to the fact that a thickness of the glass cloth is not uniform.

In order to solve these problems, it has been proposed that the multi-layer wiring substrate in which an insulating backing material made up of either impregnating the epoxy resin in a non-woven fabric made of aramid resin fibers or coating an epoxy-type adhesive on a polyimide film was used for the dielectric layer.

However, the insulating backing material using the aramid non-woven fabric or the polyimide film is highly hygroscopic whereupon there is a problem that, when the insulating backing material which has absorbed moisture is subjected to a soldering reflow, the moisture absorbed therein is vaporized to generate a gas thereby causing a separation of the dielectric layer or other unfavorable phenomena. Further, the epoxy-type adhesive is high in a dielectric constant whereupon there is another problem that transmission characteristics thereof in a high frequency region are deteriorated.

In order to solve these problems, it has been studied to use a liquid crystal polymer as a material for the dielectric layer of the multi-layer wiring substrate. Since a layer comprising the liquid crystal polymer is constituted by rigid molecules whereupon these molecules have a structure such that they are orderly aligned to some extent and an attraction force between the molecules is strong, the layer exhibits high thermal resistance, a high Young's modulus, high dimensional stability and a low hygroscopic property to have characteristics that there is no need of using a reinforcing material such as glass cloth therein and, further, it is excellent in a microfabrication property. Further, the layer has characteristics that, even in a high frequency region, it has a low dielectric constant and a low dielectric tangent and, also, an excellent high frequency property.

While making use of such characteristics of the liquid crystal polymer, Japanese Unexamined Patent Publication JP-A 8-97565 (1996) has proposed a multi-layer printed circuit substrate in which a plurality of circuit layers contain a first liquid crystal polymer and allow an adhesive layer which contains a second liquid crystal polymer having a lower melting point than that of the first liquid crystal polymer to be inserted therebetween. Further, Japanese Unexamined Patent Publication JP-A 2000-269616 (2000) has proposed a high-frequency circuit substrate in which a thermoplastic liquid crystal polymer film and a metallic foil were adhered with each other by the epoxy-type adhesive to form a liquid crystal polymer film which is then used as an electric dielectric layer.

However, in the multi-layer printed circuit substrate proposed by JP-A 8-97565, when the adhesive layer containing the liquid crystal polymer is inserted between a plurality of circuit layers and adhered them with one another by means of thermal compression bonding, due to the fact that the liquid crystal polymer is rigid to be incapable of moving into a fine dent formed on a surface of the circuit layer, there is a problem that it can not exert a sufficient anchor effect whereupon adhesiveness between the circuit layer and the adhesive layer is inferior to exhibit an insulation failure by a high temperature bias test.

Further, in the high-frequency circuit substrate proposed by JP-A 2000-269616, since a dielectric constant of the epoxy-type adhesive is different from that of the liquid crystal polymer to a great extent, by a small variation of thickness to be caused by a pressure to be applied at the time of lamination, there appears a problem that the transmission characteristics are deteriorated in the high frequency region, particularly, in a frequency region of 100 MHz or more. Further, since a film in which an orientation property of liquid crystal polymer molecules is corrupted is used, an attraction force between the liquid crystal polymer molecules becomes weak whereby coefficient of thermal expansion of liquid crystal polymer film is increased and, as a result, when the multi-layer wiring substrate is constituted by these substrates, there is a problem that a wiring failure is generated at a joint between a through-hole conductor and a wiring conductor therein by a temperature cycle test. Further, in accordance with a weak attraction force between the molecules, flexural strength becomes weak whereupon there is a problem that, when the wiring substrate is brought to be thinner than before by decreasing a thickness of the electric dielectric layer, a camber will be generated therein.

SUMMARY OF THE INVENTION

The invention has been attained to solve these problems of the prior art and has an object of providing a multi-layer wiring substrate having a high-density wiring and being excellent in soldering thermal resistance, insulating property, and high-frequency transmission characteristics.

The invention provides a multi-layer wiring substrate comprising:

a lamination of a plurality of dielectric layers which each comprise an organic material and are each provided with a wiring conductor of a metallic foil on at least one surface of upper and bottom surfaces of the respective dielectric layers, the wiring conductors between which the dielectric layer is disposed being electrically connected with each other via a through conductor formed in the dielectric layer, wherein the dielectric layers each individually are composed of a liquid crystal polymer layer and cladding layers comprising a polyphenyleneether-type organic substance, formed on upper and bottom surfaces of the liquid crystal polymer layer.

According to the invention, since the dielectric layer comprises the cladding layer which comprising the polyphenyleneether-type organic substance and are formed on a surface of the liquid crystal polymer layer, it becomes feasible to perform drilling processing for providing a fine through-hole and, as a result, a multi-layer wiring substrate having a high-density wiring can be formed. Further, since dielectric constant of the liquid crystal polymer layer and that of the cladding layer comprising the polyphenyleneether-type organic substance are the same to each other and, accordingly, frequency behaviors of both layers are the same thereby forming the multi-layer wiring substrate which is excellent in high frequency characteristics that a transmission characteristics in the high frequency region are not deteriorated regardless of a minor variation of thickness to be possibly generated at the time of lamination. Further, since the cladding layer comprising the polyphenyleneether-type organic substance exhibits a hydrophobic property similar to that of the liquid crystal polymer layer, resins of both layers are well compatible with each other and, therefore, are excellent in adhesiveness. Further, since the cladding layer has a random molecular structure and comprises a molecule which relatively easily moves by heat, the cladding layer can enter a fine dent formed on the surface of the liquid crystal polymer layer to sufficiently perform an anchor effect. As a result, the adhesiveness between the liquid crystal polymer and the cladding layer becomes favorable and there occurs no case in which an insulation failure is generated by a high temperate bias test. Further, since the liquid crystal polymer layer has a low hygroscopic property, there occurs no case in which, at the time of soldering reflow, water contained therein is vaporized to generate a gas or the dielectric layers are separated from one the other.

The invention provides a multi-layer wiring substrate comprising:

a lamination of a plurality of dielectric layers which each comprise an organic material and are each provided with a wiring conductor of a metallic foil on at least one surface of upper and bottom surfaces of the respective dielectric layers, the wiring conductors between which the dielectric layer is disposed being electrically connected with each other via a through conductor formed in the dielectric layer, wherein the dielectric layers each individually are composed of a liquid crystal polymer layer and cladding layers which are formed by laminating a first layer in which from 60% by volume to 80% by volume of inorganic insulating fillers are contained in a polyphenyleneether-type organic substance, a second layer in which from 40% by volume to 60% by volume of inorganic insulating fillers are contained in polyphenyleneether-type organic substance and a third layer in which from 20% by volume to 40% by volume of inorganic insulating fillers are contained in the polyphenyleneether-type organic substance in this order on each of upper and bottom surfaces of the liquid crystal polymer layer.

According to the invention, since the dielectric layers each individually comprise cladding layers formed by laminating a first layer in which from 60% by volume to 80% by volume of inorganic insulating fillers are contained in the polyphenyleneether-type organic substance, a second layer in which from 40% by volume to 60% by volume of the inorganic insulating fillers are contained in polyphenyleneether-type organic substance and a third layer in which from 20% by volume to 40% by volume of the inorganic insulating fillers are contained in the polyphenyleneether-type organic substance in this order on each of the upper and bottom surfaces of the liquid crystal polymer layer, coefficient of thermal expansion of the first layer which contacts the liquid crystal polymer layer in the cladding layer is approximate to that of the liquid crystal polymer layer and, as a result, no crack is generated in the cladding layer even by a temperature cycle test which includes a sharp temperature change whereupon a highly reliable multi-layer wiring substrate can be formed. Further, since a content of the inorganic insulating fillers in the third layer is set to be as small as from 20% by volume to 40% by volume, there neither occurs a case in which adhesiveness between the cladding layer and the wiring conductor is deteriorated to prevent the wiring conductor from being adhere-formed on the cladding layer, nor a case in which, when the dielectric layers are adhered to each other, adhesiveness between the cladding layers to form the dielectric layer is deteriorated to generate a separation between the dielectric layers causing a deterioration of an insulating property thereof.

The invention provides a multi-layer wiring substrate comprising:

a lamination of a plurality of dielectric layers which each comprise an organic material and are each provided with a wiring conductor of a metallic foil on at least one surface of upper and bottom surfaces of the respective dielectric layers, the wiring conductors between which the dielectric layer is disposed being electrically connected with each other via a through conductor formed in the dielectric layer, wherein the dielectric layers each individually are composed of a liquid crystal polymer layer and cladding layers each comprising a polyphenyleneether-type organic substance and another organic substance having a lower Young's modulus than that of the former organic substance formed on upper and bottom surfaces of the liquid crystal polymer layer, and wherein, in the liquid crystal polymer layer, coefficient of thermal expansion thereof in a direction of layers is from −20 ppm/° C. to 20 ppm/° C. and Young's modulus thereof is 2 GPa or more and, in the cladding layer, the Young's modulus in a direction of layers is from 0.2 GPa to 1.5 GPa.

According to the invention, since the dielectric layer comprises the cladding layer comprising polyphenyleneether-type organic substance and another organic substance having Young's modulus lower than that of the former organic substance formed on the surface of the liquid crystal polymer layer, it becomes feasible to drill-provide a fine through-hole and, as a result, the multi-layer wiring substrate having a high-density wiring can be formed. Further, since the dielectric constant of the liquid crystal polymer layer is approximate to that of the cladding layer, frequency behaviors of both layers are the same to each other thereby forming the multi-layer wiring substrate which is excellent in high frequency characteristics that a transmission characteristics in the high frequency region are not deteriorated regardless of a minor variation of thickness which is possibly generated at the time of lamination. Further, since the liquid crystal polymer layer has the coefficient of thermal expansion of from −20 ppm/° C. to 20 ppm/° C. in a direction of layers and Young's modulus thereof of 2 GPa or more and the cladding layer has the Young's modulus of from 0.2 GPa to 1.5 GPa in a direction of layers, when the cladding layer comprising the polyphenyleneether-type organic substance having a relatively large coefficient of thermal expansion undergoes a thermal expansion or a thermal contraction by a temperature change, since the Young's modulus of this cladding layer is as low as from 0.2 GPa to 1.5 GPa, the thermal expansion and the thermal contraction of the cladding layer are bound with the liquid crystal polymer layer having a small coefficient of thermal expansion and a high Young's modulus to allow the thermal expansion and thermal contraction of the cladding layer to be small. As a result, no crack is generated in the cladding layer even by a temperature cycle test which includes a sharp temperature change. Further, since it is not necessary to highly densely load the cladding layer with the inorganic insulating fillers, it is feasible that adhesiveness between the cladding layers themselves becomes favorable and, at the same time, there occurs no case in which the dielectric layers are separated from one another to deteriorate the insulating property thereof.

In the invention, it is preferable that a contact angle established between the liquid crystal polymer layer and triallyl isocyanurate is from 3° to 50°.

According to the invention, the dielectric layer comprises the cladding layers comprising the polyphenyleneether-type organic substance formed on the upper and bottom surfaces of the liquid crystal polymer layer; on this occasion, since a molecule of the polyphenyleneether-type organic substance is not so rigid as that of a liquid crystal polymer and also does not exhibit a regular orientation, the former molecule is relatively easily movable and, as a result, even in a case in which the dielectric layers are allowed to be in a multi-layer form, adhesiveness of the dielectric layers among themselves becomes favorable whereupon a multi-layer wiring substrate which does not generate a separation of the dielectric layers from one another at a high temperature bias test that causes an insulation deficiency can be fabricated. Further, even in a case in which a wiring conductor is provided on the surface of the dielectric layer, the molecule of the polyphenyleneether-type organic substance moves into a fine dent formed on a surface of the wiring conductor thereby exerting a sufficient anchor effect whereupon adhesiveness between an insulating film and the wiring conductor becomes favorable, so that a separation between the insulating film and the wiring conductor that causes a wiring failure in the wiring conductor does not occur under conditions of high temperature and high moisture. Further, since dielectric constant of the liquid crystal polymer layer and that of the cladding layer comprising the polyphenyleneether-type organic substance are substantially the same with each other, frequency behaviors of both layers are the same with each other thereby forming the dielectric layer which is excellent in high frequency transmission characteristics that do not deteriorate transmission characteristics in a high frequency region regardless of a minor variation of thickness of the cladding layer to be possibly generated by pressure to be applied when the circuit conductor is adhered thereto. Further, since a wetting property of the polyphenyleneether-type organic substance to the liquid crystal polymer layer and that of triallyl isocyanurate are approximate to each other and also the contact angle of the liquid crystal polymer layer against triallyl isocyanurate is set to be from 3° to 50°, the cladding layer comprising the polyphenyleneether-type organic substance is well compatible with the surface of the liquid crystal polymer layer whereupon adhesiveness between the liquid crystal polymer layer and the cladding layer comprising the polyphenyleneether-type organic substance can become strong and, as a result, a separation between dielectric layers does not occur by a thermal shock test such as a temperature cycle test and the like.

In the invention, it is preferable that a cross-sectional shape in a width direction of the wiring substrate provided on the dielectric layer is a trapezoid in which a first base of the wiring conductor on the side of the dielectric layer is shorter in length than a second base opposite to the first base and also an angle established between the first base and a side of the wiring conductor is from 95° to 150°.

According to the invention, since a cross-sectional shape in a width direction of the wiring substrate provided on the dielectric layer is a trapezoid in which a first base of the wiring conductor on the side of the dielectric layer is shorter in length than a second base opposite to the first base and also an angle established between the first base and a side of the wiring conductor is from 95° to 15°, when the wiring conductor is embedded in the cladding layer, it becomes feasible to embed the wiring conductor in the cladding layer in an easy manner.

In the invention, it is preferable that among sub-layers constituting the dielectric layer, a thickness x ($\mu$m) of the cladding layer positioned between the shorter base of the wiring conductor and the liquid crystal polymer layer meets the following expression:

$$3\ \mu m \leq 0.5T - t \leq x \leq 0.5T \leq 35\ \mu m \text{ (under the conditions of } 8\ \mu m \leq T \leq 70\ \mu m, \text{ and } 1\ \mu m \leq t \leq 32\ \mu m),$$

wherein T is a distance ($\mu$m) between the upper and bottom liquid crystal polymer layers, and t is a thickness ($\mu$m) of the wiring conductor, respectively.

According to the invention, since a thickness x ($\mu$m) of the cladding layer positioned between the shorter base of the wiring conductor and the liquid crystal polymer layer meets the following expression: $3\ \mu m \leq 0.5T - t \leq x \leq 0.5T \leq 35\ \mu m$, wherein T is a distance ($\mu$m) between the upper and bottom liquid crystal polymer layers, and t is a thickness ($\mu$m) of the wiring conductor, respectively, it is feasible to bring the difference between the distance between the shorter base of the wiring conductor and the liquid crystal polymer layer and the distance between the longer base of the wiring conductor and the liquid crystal polymer layer adjacent thereto to be as small as being less than t ($\mu$m) and also to bring a variation of a dielectric dissipation factor in a periphery of the wiring conductor to be small and, as a result, deterioration of the transmission characteristics can be prevented.

In the invention, it is preferable that the liquid crystal polymer layer has an anisotropic dielectric property in which the dielectric constant becomes maximum in one direction of directions parallel to a plane of the liquid crystal polymer layer, and a degree of the anisotropic dielectric property represented by a ratio $\epsilon_x/\epsilon_y$ is from 1.2 to 2.0, wherein $\in_x$ is a dielectric constant in a direction in which the dielectric constant becomes maximum among directions parallel to the plane of the liquid crystal polymer layer, and $\in_y$ is a dielectric constant in a direction orthogonal to the direction in which the dielectric constant becomes maximum among directions parallel to the plane of the liquid crystal polymer layer.

According to the invention, since the dielectric layer comprises the cladding layer comprising the polyphenyleneether-type organic substance formed on the surface of the liquid crystal polymer layer, it becomes feasible to drill the fine through-hole and, as a result, the multi-layer wiring substrate having a high-density wiring can be formed. Further, since the dielectric constant of the liquid crystal polymer layer and that of the cladding layer comprising the polyphenyleneether-type organic substance are low in the high frequency region, the multi-layer wiring substrate which is excellent in the transmission characteristics in the high frequency region can be formed. Further, since the cladding layer comprising the polyphenyleneether-type organic substance exhibits the hydrophobic property similar to that of the liquid crystal polymer layer, the compatibility thereof with the liquid crystal polymer layer is favorable whereby the adhesiveness thereof to the liquid crystal polymer layer becomes excellent. Further, since the cladding layer has a random molecular structure which permits it to move relatively easily by heat, when the wiring conductor is provided on the surface of the dielectric layer, the molecule which constitutes the cladding layer can enter the fine dent formed on the surface of the wiring conductor to exert a sufficient anchor effect and, as a result, adhesiveness between the wiring conductor and the cladding layer becomes favorable to cause no case in which an insulation failure is generated by a high temperature bias test. Further, since the liquid crystal polymer has a low hygroscopic property, there neither occur a case in which, at the time of soldering reflow, water contained therein is vaporized to generate gas, or the dielectric layers are separated from one the other.

According to the invention, since the liquid crystal polymer layer has an anisotropic dielectric property in which the dielectric constant becomes maximum in one direction of directions parallel to a plane of the liquid crystal polymer layer, and a degree of the anisotropic dielectric property represented by a ratio $\in_x/\in_y$ is from 1.2 to 2.0, wherein $\in_x$ is a dielectric constant in a direction in which the dielectric constant becomes maximum among directions parallel to the plane of the liquid crystal polymer layer, and $\in_y$ is a dielectric constant in a direction orthogonal to the direction in which the dielectric constant becomes maximum among directions parallel to the plane of the liquid crystal polymer layer, molecules of the liquid crystal polymer are regularly aligned to some extent to enhance an intermolecular force, coefficient of thermal expansion of the liquid crystal polymer layer can be decreased to a degree similar to that of a metal to be ordinarily used in the wiring conductor such as copper and, as a result, it becomes feasible to form the multi-layer wiring substrate in which wiring failure does not occur at a joint between the through conductor and the wiring conductor by the temperature cycle test.

In the invention, it is preferable that center line average roughness Ra of the upper and bottom surfaces of the liquid crystal polymer layer is from 0.05 $\mu$m to 5 $\mu$m.

In the invention, it is preferable that the cladding layer contains from 10% by volume to 70% by volume of inorganic insulating fillers.

In the invention, it is preferable that thickness of the cladding layer positioned between the liquid crystal polymer layer and the wiring conductor is from 3 $\mu$m to 35 $\mu$m.

Further, it is preferable that, in the multi-layer wiring substrate according to the invention, a first dielectric layer and a second dielectric layer adjacent to the first dielectric layer are laminated with each other such that an angle to be formed by directions in which respective dielectric constants of the liquid crystal polymer layers forming the first and second dielectric layers become maximum is from 50° to 130°.

According to the invention, since the first dielectric layer and the second dielectric layer adjacent to the first dielectric layer are laminated with each other such that the angle to be formed by directions in which respective dielectric constants of the liquid crystal polymer layers forming the first and second dielectric layers become maximum is from 50° to 130°, a particularly high flexural strength of the multi-layer wiring substrate that is expressed in a direction in which molecules are regularly aligned can be expressed in both longitudinal and transverse directions of the multi-layer wiring substrate. As a result, even when the multi-layer wiring substrate is brought to be thin, the multi-layer wiring substrate having no camber can be formed.

Further, in the invention, it is preferable that the polyphenyleneether-type organic substance is a thermosetting-type polyphenyleneether.

According to the invention, since the polyphenyleneether-type organic substance is set as the thermosetting-type polyphenyleneether, deformation by melting of the cladding layer comprising polyphenyleneether-type organic substance becomes small at the time of setting and also a case in which a position of the through conductor deviates from a position of the wiring conductor by heat-pressing at the time of forming the multi-layer wiring substrate by sequentially laminating the dielectric layers with one another are hardly to be generated whereupon the multi-layer wiring substrate which is excellent in conductive reliability can be obtained.

Further, in the invention, it is preferable that the cladding layer contains from 5% by volume to 60% by volume of an organic substance having a low Young's modulus.

According to the invention, in this structure, since the cladding layer contains from 5% by volume to 60% by volume of the organic substance having the low Young's modulus, the Young's modulus of the cladding layer can easily be brought in a range of from 0.2 GPa to 1.5 GPa.

Further, in the invention, it is preferable that the organic substance having the low Young's modulus contains from 20% by volume to 80% by volume of styrene-type organic substance.

According to the invention, in this constitution, since the organic substance having the low Young's modulus contains from 20% by volume to 80% by volume of styrene-type organic substance, this styrene-type organic substance has a low dielectric constant and dielectric tangent whereupon the multi-layer wiring substrate which is excellent in the transmission characteristics at a high frequency of 100 MHz or more can be formed.

Further, in the invention, it is preferable that a total thickness of the cladding layers is from 10% to 70% of the thickness of the dielectric layers.

Further, according to the invention, in this constitution, since the total thickness of the cladding layers is from 10% to 70% of the thickness of the dielectric layers, adhesiveness thereof with the wiring conductor is favorable whereupon the multi-layer wiring substrate having high thermal resistance, a low hygroscopic property and high dimensional stability can be formed.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

A multi-layer wiring substrate according to the present invention will hereinafter be described in detail with reference to the preferred embodiments shown in the accompanying drawings.

First Embodiment

Figure 1:
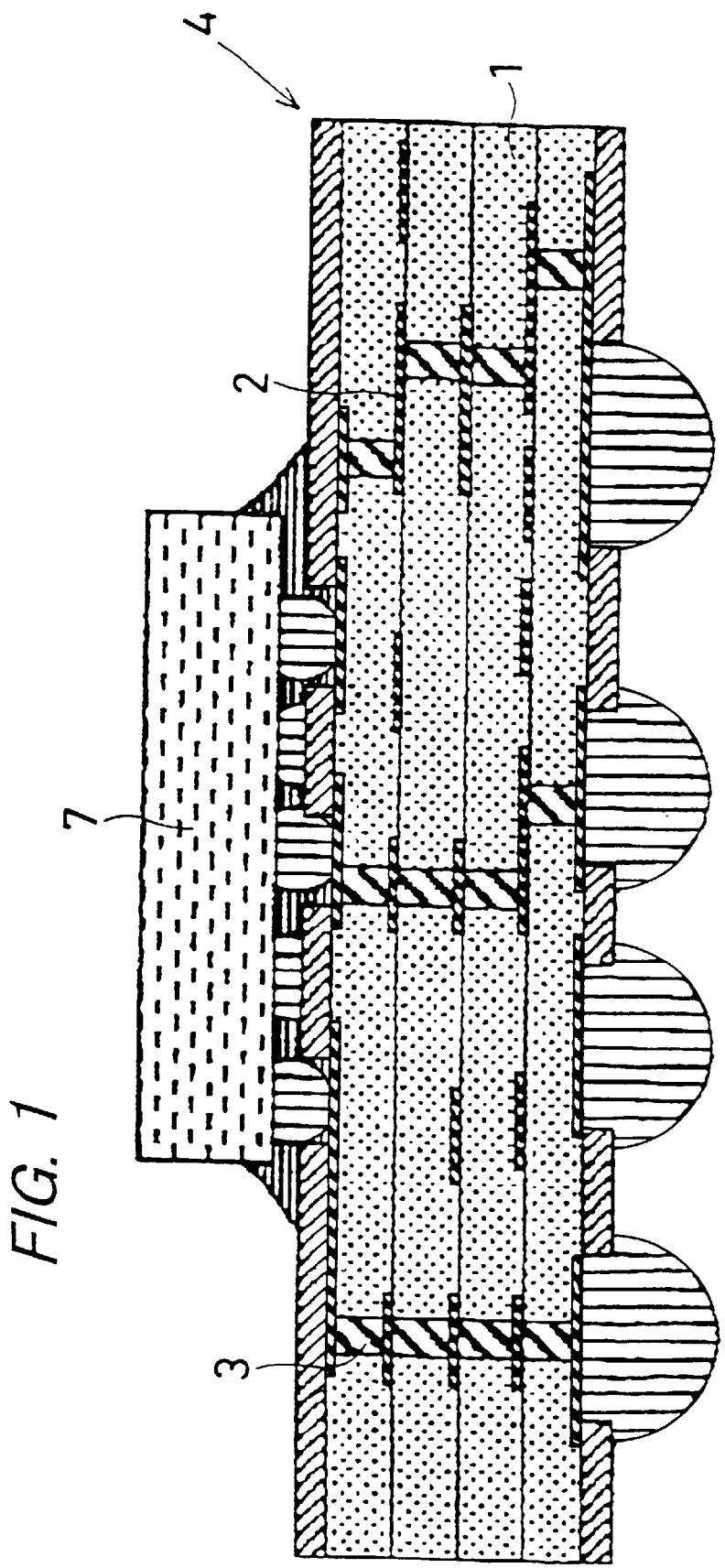
FIG. 1 is a cross-sectional view of a mixed integrated circuit comprising a semiconductor device mounted on a multi-layer wiring substrate according to a first embodiment of the present invention.
Figure 2:
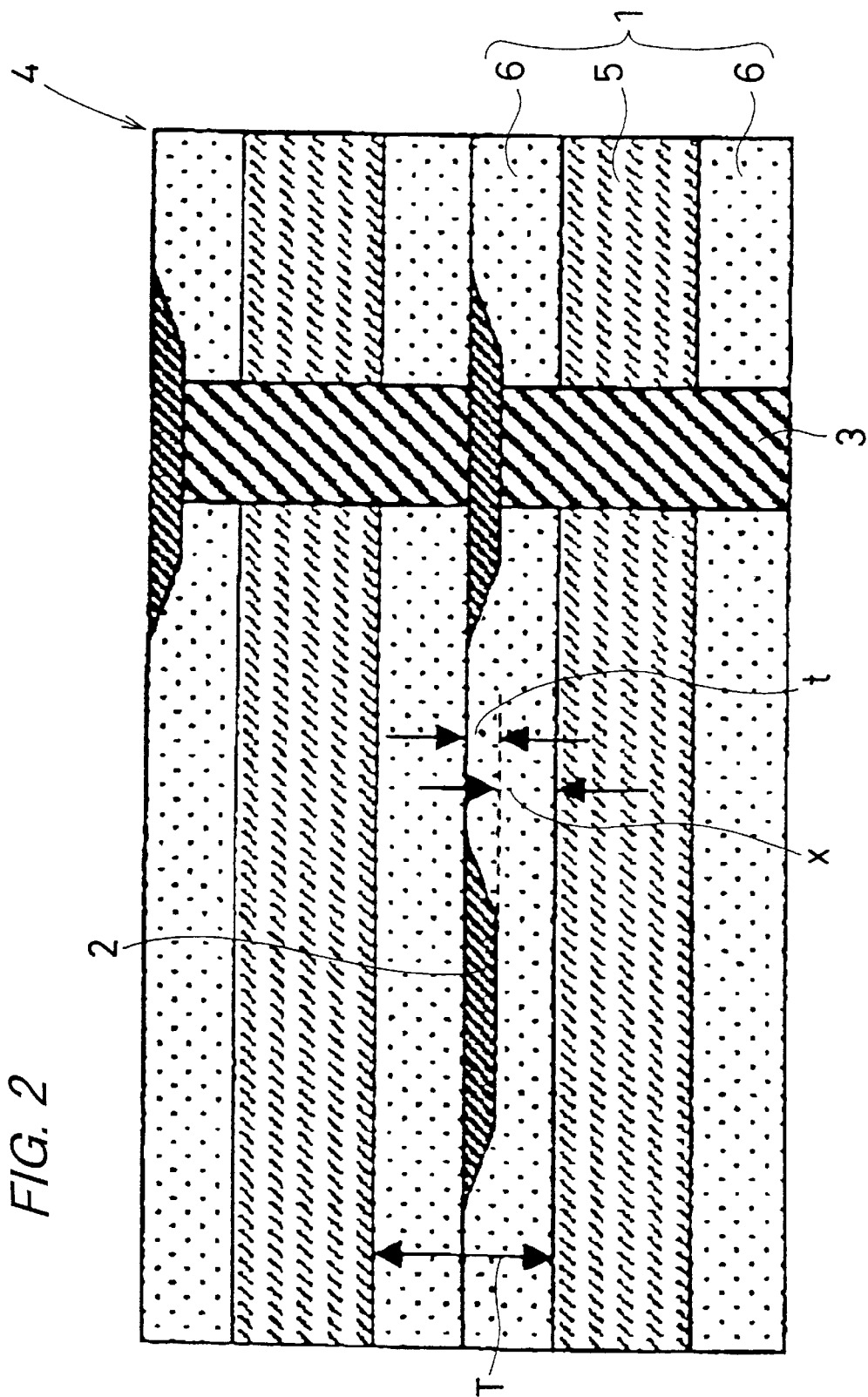
FIG. 2 is a cross-sectional view of a substantial portion of the multi-layer wiring substrate according to the first embodiment of the invention.

FIG. 1 is a cross-sectional view of a mixed integrated circuit comprising a semiconductor device mounted on a multi-layer wiring substrate according to a first embodiment of the present invention and FIG. 2 is a cross-sectional view of a substantial portion of the multi-layer wiring substrate shown in FIG. 1. In these figures, reference numerals 1, 2 and 3 denote a dielectric layer, a wiring conductor and a through conductor, respectively and a multi-layer wiring substrate 4 according to the invention is primarily constructed by these portions. Further, in the present embodiment, the multi-layer wiring substrate 4 comprising 4 layers of the dielectric layers 1 laminated with one another is shown for an illustrative purpose only and by no means for limiting it.

The dielectric layer 1 which comprises a liquid crystal polymer layer 5 and a cladding layer 6 comprising a polyphenyleneether-type organic substance adhere-formed thereon functions as a support for an electronic component 7 mounted on the multi-layer wiring substrate 4 and the wiring conductor 2.

Further, as used in the present specification, the phraseology "liquid crystal polymer" denotes a polymer exhibiting liquid crystal property in a melting states or liquid states or a polymer having a characteristic of optically birefringent at the time of melting and includes a lyotropic liquid crystal polymer which shows a liquid crystal property ordinarily in a solution state, a thermotropic liquid crystal polymer which shows the liquid crystal property at the time of melting, or the liquid crystal polymer including all of 1-type, 2-type, and 3-type thereof classified by a thermo deformation temperature. Further, the phraseology "polyphenyleneether-type organic substance" denotes a resin in which any of various types of functional groups is bonded to a polyphenyleneether resin or a polyphenyleneether, or a derivative/polymer thereof.

Further, favorable is the liquid crystal polymer having a melting point in a temperature range of from 200° C. to 400° C. and preferably from 250° C. to 350° C. from the standpoint of temperature cycle reliability, soldering thermal resistance and processability and, further, so far as physical properties thereof as a layer are not deteriorated, an antioxidant for improving the thermal resistance, a light stabilizer such as an ultraviolet absorber for improving a light resistance, a fire resistant of a halogen type or a phosphate type, a fire retardant aid such as an antimony-type compound, zinc borate barium metaborate or zirconium oxide, a lubricant for improving lubricity such as a higher fatty acid, an ester of the higher fatty acid, a metallic salt of the higher fatty acid or a fluorocarbon-type surfactant, a filler for enhancing mechanical strength such as aluminum oxide, silicon oxide, titanium oxide, barium oxide, strontium oxide, zirconium oxide, calcium oxide, zeolite, silicon nitride, aluminum nitride, silicon carbide, potassium titanate, barium titanate, strontium titanate, calcium titanate, aluminum borate, barium stannate, barium zirconate, and strontium zirconate may be contained.

Further, as for a particle shape of these fillers, there included are an approximately spherical shape, an acicular shape, a flake shape and other shapes; the approximate spherical shape among others is preferable from the standpoint of a filling property. Further, a particle diameter is ordinarily from about 0.1 μm to about 15 μm which is smaller than the thickness of the liquid crystal polymer layer 5.

Further, it is preferable that, in order to enhance adhesiveness of the liquid crystal polymer layer 5 to the cladding layer 6 comprising polyphenyleneether-type organic substance, a surface of the liquid crystal polymer layer 5 is subjected to polishing by, for example, buffing, blasting and brushing, processing by, for example, plasma, corona, ultraviolet ray and chemicals whereupon the surface thereof is roughened such that the center line average roughness Ra has a value of from 0.05 μm to 5 μm. It is preferable that the center line average roughness Ra has a value of 0.05 μm or more from the standpoint of prevention of separation of the liquid crystal polymer layer 5 from the cladding layer 6 by the soldering reflow to be performed when the electronic component 7 is mounted thereon and, further, has a value of 5 μm or less from the standpoint of prevention of entraining of air when the cladding layer 6 is formed. Accordingly, it is preferable that the liquid crystal layer 5 is formed such that the surface thereof is allowed to be a rough surface having the center line average roughness Ra in a range of from 0.05 μm to 5 μm.

Next, the cladding layer 6 comprising the polyphenyleneether-type organic substance formed on the liquid crystal polymer layer 5 not only functions as an adhesive at the time of adhere-forming the wiring conductor 2 on the dielectric layer 1 but also functions as the adhesive at the time of laminating the dielectric layers 1 with one another.

The cladding layer 6 comprises from 30% by volume to 90% by volume of polyphenyleneether-type organic substance such as a polyphenyleneether resin, a derivative thereof, a polymer alloy thereof and the like; particularly from the standpoint of enhancing thermal cycle reliability or position accuracy at the time of lamination, it is preferable that the cladding layer 6 comprising a thermosetting polyphenyleneether such as an acryl-modified polyphenyleneether and the like.

Further, when a content of the polyphenyleneether-type organic substance is less than 30% by volume, there is a tendency in which a property of kneading with a filler to be described below is deteriorated, whereas, when the content comes to be more than 90% by volume, there is a tendency in which a variance of thickness of the cladding layer 6 becomes larger than before at the time of forming the cladding layer 6 on the liquid crystal polymer layer 5. Accordingly, it is preferable that the content of the polyphenyleneether-type organic substance is in a range of from 30% by volume to 90% by volume.

Further, from the standpoint of enhancing the adhesiveness of the cladding layer 6 comprising the polyphenyleneether-type organic substance with at least one of the liquid crystal polymer layer 5, the wiring conductor 2 and the through conductor 3, it is preferable that the cladding layer 6 contains an additive such as a multi-functional monomer having two or more of polymerizable functional groups, a multi-functional polymer and the like; on this occasion, for example, it is preferable that the cladding layer 6 contains triallyl cyanulate, triallyl isocyanurate or derivatives thereof.

Further, the cladding layer 6 may contain a rubber component for adjusting Young's modulus, an antioxidant for improving thermal stability, a light stabilizer such as a ultraviolet ray absorber for improving light resistance, a halogen-type or phosphate-type fire retardant for improving fire retardance, a fire retardant aid such as an antimony-type compound, zinc borate, barium metaborate and zirconium oxide, a lubricant such as a higher fatty acid, a higher fatty acid ester, a metallic salt of a higher fatty acid and a fluorocarbon-type surfactant for improving lubricity, a filler such as aluminum oxide, silicon oxide, titanium oxide, barium oxide, strontium oxide, zirconium oxide, calcium oxide, zeolite, silicon nitride, aluminum nitride, aluminum nitride, silicon carbide, calcium titanate, barium titanate, strontium titanate, calcium titanate, aluminum borate, barium stannate, barium zirconate and strontium zirconate for adjusting coefficient of thermal expansion or enhancing mechanical strength, or a coupling agent such as a silane-type coupling agent, a titanate-type coupling agent and the like for enhancing affinity with the filler thereby enhancing a bonding property therebetween and mechanical strength thereof.

Particularly, from the standpoint that, when the dielectric layers 1 are laminated with one another and pressed, flowability of the cladding layer 6 is suppressed and deviation of position of the through conductor 3 and variation of thickness of the cladding layer 6 are prevented, it is preferable that the cladding layer 6 contains 10% by volume or more of inorganic insulating fillers as a filler. Further, from the standpoint that a separation at an adhesion interface thereof with the liquid crystal polymer layer 5 or the adhesion interface thereof with the wiring conductor 2 at the time of the soldering reflow is prevented, it is preferable that a content of the filler is 70% by volume or less. Accordingly, it is preferable that from 10% by volume to 70% by volume of filler is allowed to be contained in the cladding layer 6 comprising the polyphenyleneether-type organic substance.

Further, as for shapes of the filler and other materials hereinbefore described, there included are an approximately spherical shape, an acicular shape, a flake shape and other shapes; from the standpoint of a filling property, the approximately spherical shape is preferable and, on this occasion, a particle diameter thereof is from about 0.1 $\mu$m to about 15 $\mu$m which is smaller than the thickness of the cladding layer 6.

According to the multi-layer wiring substrate 4 of the invention, the dielectric constant of the liquid crystal polymer layer 5 and that of the cladding layer 6 comprising the polyphenyleneether-type organic substance are the same to each other and, accordingly, the frequency behaviors of both layers are the same to each other whereupon, even when a minor variation of thickness occurs at the time of lamination, the multi-layer wiring substrate 4 which is excellent in high-frequency transmission characteristics such that the transmission characteristics in the high frequency region are not deteriorated can be formed. Further, since the cladding layer 6 exhibits a hydrophobic property in a similar degree to that of the liquid crystal polymer layer 5, affinity between the resins is favorable and, accordingly, adhesiveness therebetween becomes excellent. Further, since the cladding layer 6 has a random molecular structure and comprising molecules which move relatively easily by heat, when the wiring conductor 2 is provided on the surface of the dielectric layer 1, it can enter the recess formed on the surface of the liquid crystal polymer layer 5 thereby exerting a sufficient anchor effect. As a result, adhesiveness between the liquid crystal polymer layer 5 and the cladding layer 6 becomes favorable to form the multi-layer wiring substrate 4 which is excellent in thermal resistance and the insulating property such that the insulation failure does not occur by the high temperature bias test.

Such dielectric layer 1 is fabricated such that, after the cladding layer 6 is formed by applying a paste obtained by adding a thermosetting polyphenyleneether resin, a solvent, a plasticizer, or a dispersant to inorganic insulating fillers such as silicon oxide having a particle diameter of from about 0.1 $\mu$m to about 15 $\mu$m on upper and bottom surfaces of the liquid crystal polymer layer 5 by employing a sheet forming method such as a doctor blade method and the like, or after the cladding layer 6 is formed on the surface of the liquid crystal polymer layer 5 by first immersing the liquid crystal polymer layer 5 in the paste prepared above and then pulling up the liquid crystal polymer layer 5 from the paste perpendicularly, the thus-formed cladding layer 6 is heat-dried at from 60° C. to 100° C. for from 5 minutes to 3 hours.

Further, from the standpoint of securing insulating reliability, thickness of the dielectric layer 1 is preferably from 10 $\mu$m to 200 $\mu$m and, on the other hand, from the standpoint of securing high thermal resistance, a low hygroscopic property and dimension stability, thickness of the liquid crystal polymer layer 5 is preferably set to be in a range of from 40% to 90% the thickness of the dielectric layer 1.

Further, the wiring conductor 2 is adhere-formed on at least one surface of upper and bottom surfaces of the dielectric layer 1. The wiring conductor 2 has thickness of from 2 μm to 30 μm, comprises a metallic foil having favorable conductivity such as copper, gold and the like and has a function to electrically connect the electronic component 7 mounted on the multi-layer wiring substrate 4 to an external electric circuit (not shown).

From the standpoint of preventing a void from being generated in the periphery of the wiring conductor 2 when a plurality of the dielectric layers 1 are laminated with one another, it is preferable that the wiring conductor 2 is embedded in the cladding layer 6 such that at least the surface of the wiring conductor 2 and the surface of the cladding layer 6 become flat along the surface of the cladding layer 6. Further, when the wiring conductor 2 is embedded in the cladding layer 6, by maintaining porosity of the cladding layer 6 to be from 3% by volume to 40% by volume on a dry basis, a buildup of the resin of the cladding layer 6 in the periphery of the wiring conductor 2 is not generated whereupon the surface of the dielectric layer 1 can be formed flat and also air which is present in a space between the wiring conductor 2 and the cladding layer 6 can easily be discharged thereby being capable of preventing an air bubble from being entrapped. Further, when the porosity of the cladding layer 6 is more than 40% by volume on a dry basis, after a plurality of the dielectric layers 1 are subjected to a press-heat setting operation, a pore remains in the cladding layer 6 and, on this occasion, the thus-remained pore absorbs moisture in the air whereupon there is a risk of deteriorating the insulating property of the cladding layer 6; therefore, it is preferable that the porosity of the cladding layer 6 is from 3% by volume to 40% by volume on a dry basis.

Such porosity of the cladding layer 6 on a dry basis can be arranged such that the porosity has a predetermined value by appropriately adjusting drying conditions such as a drying temperature, temperature raising rate and the like when the cladding layer 6 is applied on the surface of liquid crystal polymer layer 5 and dried.

Further, it is preferable that thickness of the cladding layer 6 positioned between the wiring conductor 2 and the liquid crystal polymer layer 5 is set to be from 3 μm to 35 μm. By setting the thickness of the cladding layer 6 positioned between the wiring conductor 2 and the liquid crystal polymer layer 5 to be from 3 μm to 35 μm, and by bring the wiring conductor 2 and the liquid crystal polymer layer 5 having a low dielectric tangent to be close to each other, the dielectric tangent in the periphery of the wiring conductor 2 can be lowered and, as a result, the transmission characteristics in a high frequency region, particularly, 100 MHz or more can be enhanced. Further, when the thickness of the cladding layer 6 is less than 3 μm, stress which is generated by the thermal expansion or contraction can not be effectively relaxed whereupon there is a tendency of generating a crack at a corner portion of the wiring conductor 2 and, on the other hand, when the thickness thereof is more than 35 μm, there is a tendency of deteriorating the effect of lowering the dielectric tangent in the periphery of the wiring conductor 2. Therefore, it is preferable that the thickness of the cladding layer 6 positioned between the wiring conductor 2 and the liquid crystal polymer layer 5 is maintained to be in a range of from 3 μm to 35 μm.

Further, it is preferable that a cross-sectional shape in a breadth direction of the wiring conductor 2 arranged on the dielectric layer 1 is formed in a trapezoid in which a length of a first base on the side of the dielectric layer 1 is shorter than that of a second base which is opposite to the first base and also an angle established between the first base on the side of the dielectric layer 1 and a side is from 95° to 150°. By forming the cross-sectional shape in the breadth direction of the wiring conductor 2 arranged on the dielectric layer 1 in a trapezoid in which a length of a first base on the side of the dielectric layer 1 is shorter than that of a second base which is opposite to the first base and also setting an angle established between the first base of the trapezoid on the side of the dielectric layer 1 and the side of the trapezoid to be from 95° to 150°, when the wiring conductor 2 is embedded in the cladding layer 6, it is feasible to easily embed the wiring conductor 2 in the cladding layer 6. Further, from the standpoint of embedding the wiring conductor 2 therein without entraining air, it is preferable that the angle established between the base of the trapezoid on the side of the dielectric layer 1 and the side of the trapezoid is 95° or more; on this occasion, from the standpoint of miniaturizing the wiring conductor 2, the angle is preferably 150° or less.

Further, among layers of a plurality of dielectric layers 1, when a distance between the upper and bottom liquid crystal polymer layers 5, and thickness of the wiring conductor 2 are represented by T (μm) and t (μm), respectively, among sub-layers constituting the dielectric layer 1, thickness x (μm) of the cladding layer 6 positioned between the shorter base of the wiring conductor 2 and the liquid crystal polymer layer 5 satisfies the following numerical expression:

$3\ \mu m \leq 0.5T - t \leq x \leq 0.5T \leq 35\ \mu m$ (under the conditions of $8\ \mu m \leq T \leq 70\ \mu m$, and $1\ \mu m \leq t \leq 32\ \mu m$).

When the distance between the liquid crystal polymer layers 5 and the thickness of the wiring conductor 2 are represented by T (μm) and t (μm), respectively, by allowing the shorter base of the wiring conductor 2 and the thickness x (μm) of the cladding layer 6 comprising the polyphenyleneether-type organic substance between the liquid crystal polymer layers 5 to satisfy the numerical expression: $3\ \mu m \leq 0.5T - t \leq x \leq 0.5T \leq 35\ \mu m$, difference between the distance between the shorter base of the wiring conductor 2 and the liquid crystal polymer 5, and a distance between longer base of the wiring conductor 2 and the liquid crystal polymer layer 5 can be set to be as small as less than t (μm), and the variance of the dielectric tangent in the periphery of the wiring conductor 2 can be small and, as a result, deterioration of the transmission characteristics are prevented. Therefore, when the distance between the liquid crystal layers 5 and the thickness of the wiring conductor 2 are represented by T (μm) and t (μm) respectively, it is preferable that the thickness x (μm) of the cladding layer 6, comprising the polyphenyleneether-type organic substance, which is positioned between the shorter base of the wiring conductor 2 and the liquid crystal polymer layer 5 is set to be in a range of $3\ \mu m \leq 0.5T - t \leq x \leq 0.5T \leq 35\ \mu m$.

Such wiring conductor 2 is formed by forming a pattern on a precursor sheet which will eventually become a dielectric layer 1 by a subtractive method employing a known photoresist and adhere-forming a metallic foil comprising, for example, copper by using a transfer method and the like. This type of adhere-forming is performed such that, firstly, a metallic foil transfer film in which a metallic foil comprising copper is adhered on a film that will eventually become a support via an adhesive is prepared and, secondly, the metallic foil on the film is etched in a pattern form using the subtractive method employing the known photoresist. On this occasion, a side surface on the side of the surface of the pattern is contacted with an etching solution for a longer period of time than the side surface of the film and, accordingly, is likely etched thereby allowing a cross-sectional shape of the pattern in a breadth direction to be a trapezoid. Further, such trapezoidal shape can have an angle of from 95° to 150° established between the shorter base and the side by adjusting a concentration of the etching solution or an etching time. Further, this metallic foil transfer film is stacked with the precursor sheet which will become the dielectric layer 1 and, then, hot-pressed for from 10 minutes to 1 hour under conditions that a temperature is from 100° C. to 200° C. and a pressure is from 0.5 MPa to 10 MPa and, thereafter, the film which will eventually become a support is removed, and the metallic foil in a pattern form is transferred to the surface of the precursor sheet which will eventually become the dielectric layer 1 whereupon the wiring conductor 2 having the cross-sectional shape of trapezoid whose shorter base is embedded in the cladding layer 6 comprising polyphenyleneether-type organic substance can be formed.

Further, the thickness x ($\mu$m) of the cladding layer 6 between the shorter base of the wiring conductor 2 and the liquid crystal polymer layer 5 which is opposite to the shorter base can be arranged to be from 3 $\mu$m to 35 $\mu$m by adjusting a pressure of a hot-press operation at the time of metallic foil transfer. Further, in order to enhance adhesiveness of the wiring conductor 2 with the cladding layer 6, it is preferable that the surface of the wiring conductor 2 is beforehand subjected to a polishing operation such as buffing, blasting and brushing, a chemical treatment and the like to allow the surface thereof to be roughened.

Further, in the dielectric layer 1, the through conductor 3 having a diameter of from 20 $\mu$m to 150 $\mu$m is formed therein. The through conductor 3 has a function of electrically connecting the dielectric layers 1 positioned above and below the wiring conductor 2 such that the dielectric layers 1 sandwiches the wiring conductor 2. After a through hole is formed by performing drilling processing on the dielectric layer 1 by means of a laser, the through conductor 3 is formed by embedding a conductive paste comprising copper, silver, gold, solder and the like in the thus-formed through hole by a known screen printing method.

According to the multi-layer wiring substrate 4 of the invention, since the dielectric layer 1 has the cladding layer 6 comprises the polyphenyleneether-type organic substance on the upper and bottom surfaces of liquid crystal polymer layer 5, the liquid crystal polymer layer 5 has high thermal resistance, high Young's modulus, high dimensional stability and a low hygroscopic property whereupon the dielectric layer 1 can be constructed without using a reinforcing material such as glass cloth and, as a result, the drilling processing to be performed by a laser is facilitated to form a fine uniform through hole.

After the through conductor 3 is formed in a desired position of a precursor sheet which will eventually become the dielectric layer 1 by the aforementioned method, a pattern-formed metallic foil of, for example, copper is transferred on the thus-treated precursor sheet by hot-pressing at a temperature of from 100° C. to 200° C. under a pressure of from 0.5 MPa to 10 MPa for from 10 minutes to 1 hour to such multi-layer wiring substrate 4 and, then, a plurality of the thus-prepared sheet are laminated with one another to form a laminate and, thereafter, the thus-prepared laminate is subjected to hot-pressing at a temperature of from 150° C. to 300° C. under a pressure of from 0.5 MPa to 10 MPa for from 30 minutes to 24 hours to achieve a complete setting thereof whereupon such multi-layer wiring substrate 4 is fabricated.

Thus, according to the multi-layer wiring substrate 4, since the dielectric layer 1 has the cladding layer 6 comprising the polyphenyleneether-type organic substance on the surface of the liquid crystal polymer layer 5, the multi-layer wiring substrate 4 which is excellent not only in the high-frequency transmission characteristics but also in moisture resistance, soldering thermal resistance and an insulating property can be formed.

Further, the multi-layer wiring substrate 4 according to the invention is by no means limited to embodiments described above, but various types of modifications are feasible so long as these modifications do not depart from the scope and spirit of the invention. Take, for example, the foregoing embodiment in which four layers of the dielectric layers 1 are laminated with one another to fabricate the multi-layer wiring substrate 4; however, 2 layers, 3 layers or 5 layers or more of the dielectric layers 1 may be laminated with one another to fabricate the multi-layer wiring substrate 4. Further, a build-up layer or a solder resist layer comprising 1 layer, 2 layers or 3 layers or more of dielectric layers containing an organic resin as a primary component may be formed on above and/or under surfaces of the multi-layer wiring substrate 4 in the invention.

Next, the multi-layer wiring substrate according to the first embodiment of the invention was evaluated by means of a sample fabricated as described below.

EXAMPLE 1

First, spherical fused silica having an average particle diameter of 0.6 $\mu$m was added to a thermosetting-type polyphenyleneether resin such that a content thereof becomes 40% by volume to produce a mixture and, then, toluene as a solvent and a catalyst for acceleration of setting of the organic resin were added to the thus-prepared mixture and agitated for one hour to prepare a varnish. Subsequently, a surface of a liquid crystal polymer layer having a melting point of 320° C. was subjected to plasma processing to prepare the liquid crystal polymer layer having a thickness of 35 $\mu$m and a center line average roughness Ra of 0.10 $\mu$m and, then, the thus-prepared varnish was coated on an upper surface of the thus-prepared liquid crystal polymer layer by a doctor blade method to form a cladding layer comprising a thermosetting-type polyphenyleneether having a thickness of about 20 $\mu$m in a dry state. Subsequently, another cladding layer comprising a polyphenyleneether was also formed on a bottom surface of the liquid crystal polymer layer in a same manner as described above to fabricate a precursor sheet which will eventually become a dielectric layer. Further, a through hole having a diameter of 65 $\mu$m was formed in this precursor sheet by a $CO_2$ laser and, then, a conductive paste containing copper powders and an organic binder was embedded in this through hole by a screen printing method to form a through conductor.

Next, after a transfer support film attached with a copper foil having a thickness of 12 $\mu$m which had been formed in a circuit pattern and the precursor sheet comprising the through conductor formed therein which will eventually becomes a dielectric layer were positioned in registry with each other and applied with a pressure of 3 MPa for 30 seconds in a vacuumized laminating apparatus and, thereafter, the transfer support film was removed therefrom to embed the wiring conductor in the precursor sheet. Lastly, 4 sheets of precursor sheets on which this wiring conductor was formed were laminated with one another, subjected to heating processing at a temperature of 200° C. under a pressure of 3 MPa for 5 hours for a complete setting to obtain the multi-layer wiring substrate.

Further, as for a test substrate for an evaluation of the insulating property, a wiring conductor in a pectinate pattern having a wiring width of 50 $\mu$m and a wiring space of 50 $\mu$m was formed in the multi-layer wiring substrate, whereas, as for a test substance for an evaluation of the transmission characteristics, a wiring conductor having a strip line structure was formed in the multi-layer wiring substrate.

Comparative Example 1

A multi-layer wiring substrate for use in Comparative Example 1 was fabricated by firstly forming a wiring conductor in a circuit pattern on a liquid crystal polymer layer having a copper foil heat-fused on a surface thereof and having a melting point of 320° C. by using photoresist and, then, forming a through hole having a diameter of 65 $\mu$m by using a $CO_2$ laser and, further, forming a through conductor by embedding a conductive paste containing copper powders and an organic binder in the thus-formed through hole by screen printing thereby forming a circuit substrate and, thereafter, sandwiching the liquid crystal polymer layer having a melting point of 280° C. by the thus-formed circuit substrates to form a laminate and, lastly, heat-pressing the thus-formed laminate at a temperature of 285° C. under a pressure of 1 MPa for 5 minutes.

Comparative Example 2

A multi-layer wiring substrate for use in Comparative Example 2 was fabricated in the same manner as in the multi-layer wiring substrate for use in Comparative Example 1 except for using a liquid crystal polymer layer having a copper foil adhered to a surface thereof via epoxy resin-type adhesive and having a melting point of 320° C.

As for the evaluation of the insulating property, a high temperature bias test was executed under conditions of a temperature of 130° C., relative humidity of 85% and applied potential of 5.5 V, insulating resistance between wiring conductors after 168 hours was measured and a variation between measurements before and after the test was examined thereby evaluating the insulating property. Further, as for the evaluation of the transmission characteristics, the transmission characteristics in a frequency region of from 100 MHz to 40 GHz were measured using a sample having a strip structure thereby evaluating the transmission characteristics.

Evaluation results of the insulating property and transmission characteristics are shown in Tables 1 and 2, respectively.

TABLE 1

| | Insulating resistance/$\Omega$ | |
|---|---|---|
| Sample | Before test | After high temperature bias test |
| Example 1 | $9.5 \times 10^{12}$ | $4.3 \times 10^{10}$ |
| Comparative Example 1 | $8.6 \times 10^{12}$ | $3.5 \times 10^{6}$ |
| Comparative Example 2 | $8.4 \times 10^{12}$ | $8.2 \times 10^{8}$ |

TABLE 2

| | Transmission characteristics/dB · cm$^{-1}$ | | | |
|---|---|---|---|---|
| Sample | 100 MHz | 1 GHz | 20 GHz | 40 GHz |
| Example 1 | −0.01 | −0.05 | −0.22 | −0.51 |
| Comparative Example 1 | −0.01 | −0.04 | −0.20 | −0.51 |
| Comparative Example 2 | −0.05 | −0.26 | −1.02 | −2.08 |

From Table 1, since, in the multi-layer wiring substrate in Comparative Example 1, the insulating resistance became as small as $3.5 \times 10^6 \Omega$ after the high temperature bias test, the multi-layer wiring substrate in Comparative Example 1 was found to be inferior in thermal resistance. Further, from Table 2, since, in the multi-layer wiring substrate of Comparative Example 2, the transmission characteristics were deteriorated as being −1.0 dB or less in the high frequency region of 20 GHz or more, the multi-layer wiring substrate of Comparative Example 2 was found to be inferior in the high-frequency transmission characteristics.

On the other hand, the multi-layer wiring substrate according to the invention was excellent such that the insulating resistance was as large as $4.3 \times 10^{10} \Omega$ even after the high temperature bias test and the transmission characteristics were as small as −0.51 dB even in the high frequency region of 40 GHz.

Second Embodiment

In the first embodiment, a multi-layer wiring substrate in which a plural layers of dielectric layers each comprising cladding layers comprising a polyphenyleneether-type organic substance formed on upper and bottom surfaces of a liquid crystal polymer layer are laminated with one another was shown.

As shown in the first embodiment, in the multi-layer wiring substrate in which a plural layers of dielectric layers each comprising cladding layers comprising polyphenyleneether-type organic substance formed on upper and bottom surfaces of a liquid crystal polymer layer are laminated with one another, since coefficient of thermal expansions of the cladding layer and the liquid crystal polymer layer are different from each other, there is a tendency in which a crack is likely to be generated in the cladding layer in a temperature cycle test which includes a sharp temperature change. Further, there is a method of preventing such crack from being generated in the temperature cycle test by allowing the coefficient of thermal expansions of the cladding layer and the liquid crystal polymer layer to be similar to each other by means of filling inorganic insulating fillers into the cladding layer highly densely; however, on this occasion, there is a tendency in which adhesiveness between the cladding layer and the wiring conductor is deteriorated whereupon the wiring conductor can not be adhere-formed and, at the same time, when the dielectric layers are adhered with each other, adhesiveness between the cladding layers which each form a dielectric layer is deteriorated to cause a separation between the dielectric layers whereupon an insulating property is likely to be deteriorated.

The second embodiment according to the invention has been performed to solve the problems described above.

Figure 3:
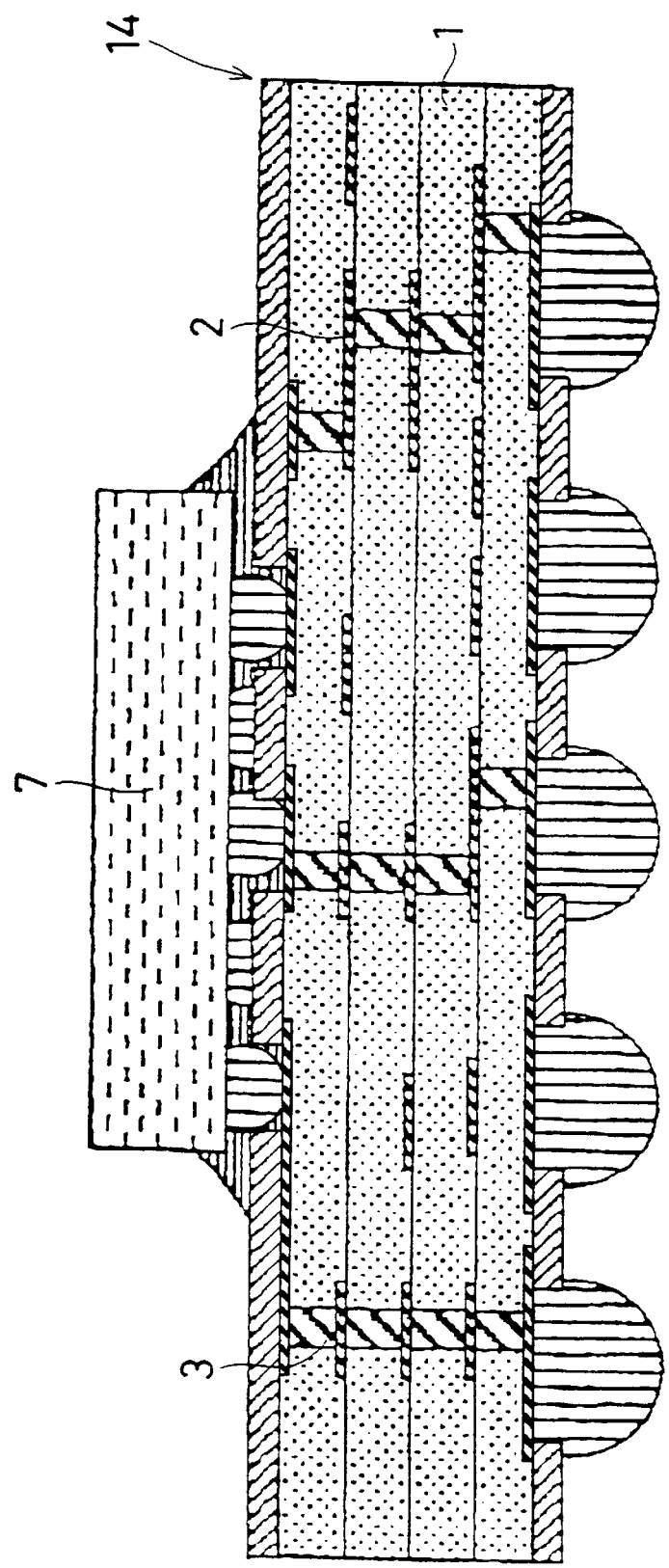
FIG. 3 is a cross-sectional view of a mixed integrated circuit comprising a semiconductor device mounted on a multi-layer wiring substrate according to a second embodiment of the invention.
Figure 4:
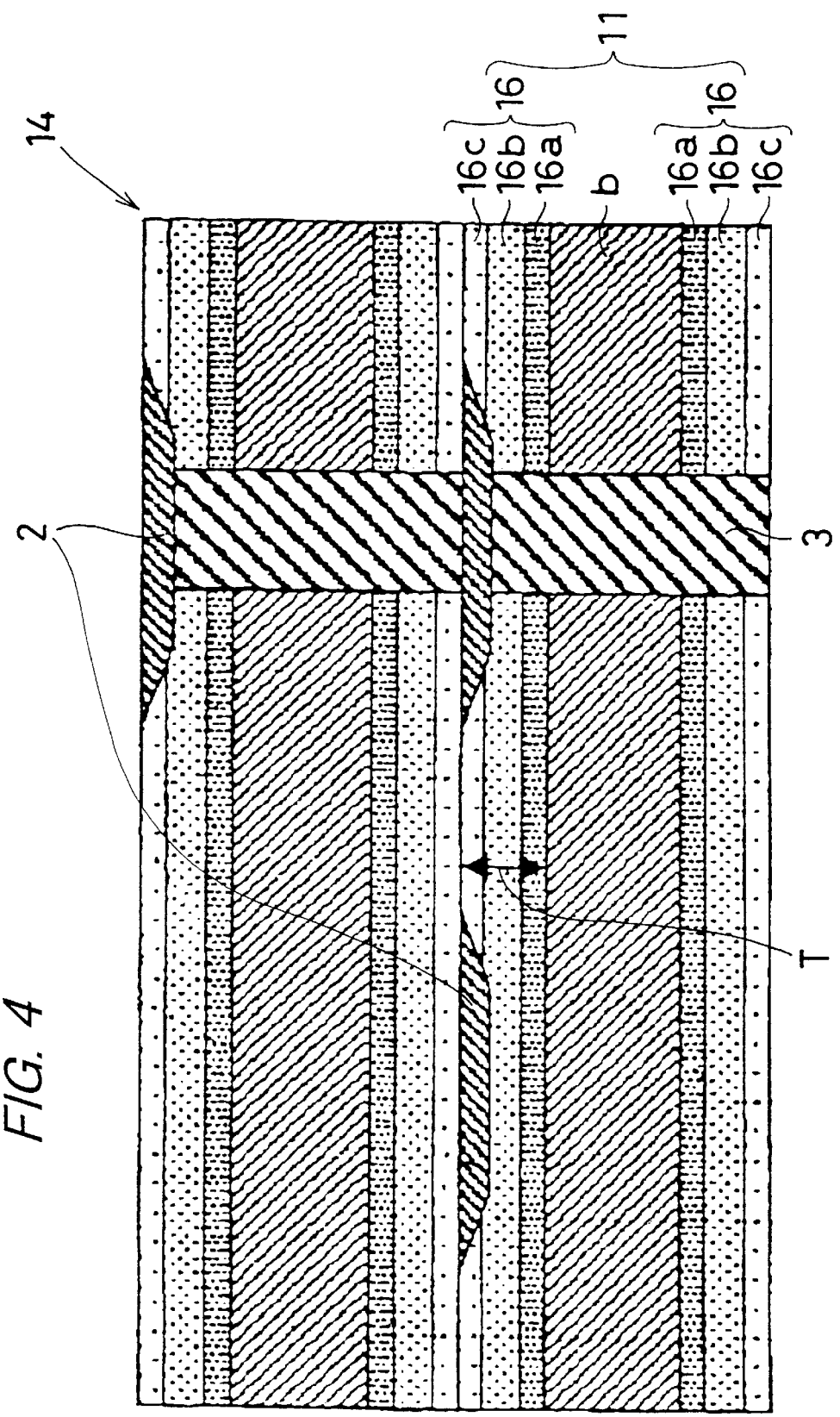
FIG. 4 is an enlarged cross-sectional view of a substantial portion of a multi-layer wiring substrate according to a second embodiment of the invention.

FIG. 3 is a cross-sectional view of a mixed integrated circuit comprising a semiconductor device mounted on a multi-layer wiring substrate according to a second embodiment of the present invention and FIG. 4 is an enlarged cross-sectional view of a substantial portion of the multi-layer wiring substrate shown in FIG. 3. In this embodiment, parts corresponding to the above-mentioned embodiment are denoted same numerals and explanations with respect to them are omitted. In these figures, reference numerals 11, 2 and 3 denote a dielectric layer, a wiring conductor and a through conductor, respectively and a multi-layer wiring substrate 14 according to the invention is primarily constructed by these portions. Further, in the present embodiment, the multi-layer wiring substrate 14 comprising 4 layers of the dielectric layers 11 laminated with one another is shown for an illustrative purpose only and by no means for limiting it.

The dielectric layer 11, which comprises a liquid crystal polymer layer 5 and a cladding layer 16 adhered thereon formed by containing the inorganic insulating fillers in the polyphenyleneether-type organic substance, functions as a support for an electronic component 7 mounted on the multi-layer wiring substrate 14 and the wiring conductor 2.

It is preferable that, in order to enhance adhesiveness of the liquid crystal polymer layer 5 to the cladding layer 16 formed by containing the inorganic insulating fillers in the polyphenyleneether-type organic substance, a surface of the liquid crystal polymer layer 5 is subjected to polishing by, for example, buffing, blasting and brushing, processing by, for example, plasma, corona, ultraviolet ray and chemicals whereupon the surface thereof is roughened such that the center line average roughness Ra has a value of from 0.05 $\mu$m to 5 $\mu$m. It is preferable that the center line average roughness Ra has a value of 0.05 $\mu$m or more from the standpoint of prevention of separation of the liquid crystal polymer layer 5 from the cladding layer 16 by the soldering reflow to be performed and, further, has a value of 5 $\mu$m or less from the standpoint of prevention of entraining of air when the cladding layer 16 is formed.

The cladding layer 16 comprising the polyphenyleneether-type organic substance with inorganic insulating fillers not only functions as an adhesive at the time of adhere-forming the wiring conductor 2 on the dielectric layer 11 but also functions as the adhesive at the time of laminating the dielectric layers 11 with one another.

The cladding layer 16 comprises from 20% by volume to 80% by volume of polyphenyleneether-type organic substance such as a polyphenyleneether resin, a derivative thereof, a polymer alloy thereof and the like; particularly from the standpoint of enhancing thermal cycle reliability or position accuracy at the time of lamination, it is preferable that the cladding layer 6 comprising a thermosetting polyphenyleneether such as an acryl-modified polyphenyleneether and the like.

Further, when a content of the polyphenyleneether-type organic substance is less than 20% by volume, there is a tendency in which a property of kneading is deteriorated, whereas, when the content comes to be more than 80% by volume, there is a tendency in which a variance of thickness of the cladding layer 16 becomes larger than before at the time of forming the cladding layer 16 on the liquid crystal polymer layer 5. Accordingly, it is preferable that the content of the polyphenyleneether-type organic substance is in a range of from 20% by volume to 80% by volume.

Further, from the standpoint of enhancing the adhesiveness of the cladding layer 16 with at least one of the liquid crystal polymer layer 5, the wiring conductor 2 and the through conductor 3, as is the case with the cladding layer 6 in the first embodiment, it is preferable that the cladding layer 6 contains an additive such as a multi-functional monomer having two or more of polymerizable functional groups, a multi-functional polymer and the like; on this occasion, for example, it is preferable that the cladding layer 6 contains triallyl cyanulate, triallyl isocyanurate or derivatives thereof.

Further, cladding layer 16 is formed by laminating a first layer 16a in which from 60% by volume to 80% by volume of inorganic insulating fillers are contained in the polyphenyleneether-type organic substance, a second layer 16b in which from 40% by volume to 60% by volume of the inorganic insulating fillers are contained in the polyphenyleneether-type organic substance and a third layer 16c in which from 20% by volume to 40% by volume of the inorganic insulating fillers are contained in the polyphenyleneether-type organic substance in this order on each of the upper and bottom surfaces of the liquid crystal polymer layer. The above features are important to the invention.

In the multi-layer wiring substrate 14 according to the invention, since the cladding layer 16 has the structure as described above, coefficient of thermal expansion of the first layer 16a is approximate to that of the liquid crystal polymer layer 5 and, as a result, no crack is generated in the cladding layer 16 even by a temperature cycle test which includes a sharp temperature. Further, since a content of the inorganic insulating fillers in the third layer 16c is set to be as small as from 20% by volume to 40% by volume, there neither occurs a case in which adhesiveness between the cladding layer 16 and the wiring conductor 2 is deteriorated to prevent the wiring conductor 2 from being adhere-formed on the cladding layer 16 nor occurs a case in which, when the dielectric layers 11 are adhered to each other, adhesiveness between the cladding layers 16 to form the dielectric layer 11 is deteriorated to generate a separation between the dielectric layers 11 causing a deterioration of an insulating property thereof.

Further, from the standpoint of allowing the coefficient of thermal expansion of the cladding layer 16 to be approximate to that of the liquid crystal polymer layer 5 when the thickness of the cladding layer 16 is represented by T, it is preferable that the thickness of the first layer 16a is 0.2 T or more and, from the standpoint of allowing the wiring conductor 2 to be favorably embedded in the cladding layer 16, it is preferable that the first layer 16a is less than 0.3 T. Further, from the standpoint of allowing stress to be generated by the difference between the coefficient of thermal expansions of the first layer 16a and the third layer 16c to be relaxed, it is preferable that the thickness of the second layer 16b is 0.4T or more and, from the standpoint of an effect which allows the coefficient of thermal expansions of the first layer 16a to be approximate to that of the liquid crystal polymer layer 5 as well as allowing adhesiveness of the third layer 16c to be sufficiently executed, it is preferable that the thickness of the second layer 16b is 0.6T or less. From the standpoint of allowing the adhesiveness of the third layer 16c with the provided wiring conductor 2 provided thereon to be favorable, it is preferable that the thickness of the third layer 16c is 0.2 T or more and, from the standpoint of preventing a wiring failure from being generated by the thermal expansion in a thickness direction, it is preferable that the thickness of the third layer 16c is less than 0.3 T.

Further, from the standpoint of allowing the coefficient of thermal expansion of the first layer 16a to be approximate to that of the liquid crystal polymer layer 5, it is preferable that the content of the inorganic insulating fillers in the first layer 16a is 60% by volume and, from the standpoint of allowing the adhesiveness between the liquid crystal polymer layer 5 and the second layer 16b to be favorable, it is preferable that the content of the inorganic insulating fillers in the first layer 16a is 80% by volume or less. Further, from the standpoint of allowing stress to be generated by the difference between the coefficient of thermal expansions of the first and second layers 16a and 16b to be relaxed, it is preferable that the content of the inorganic insulating substance in the second layer 16b is 40% by volume or more and, from the standpoint of allowing stress generated by the difference between the coefficient of thermal expansions of the second and third layers 16b and 16c to be relaxed, it is preferable that the content of the inorganic insulating substance in the second layer 16b is 60% by volume or less. Further, from the standpoint of preventing a resin from being flowed in pressing processing at the time the third layer 16c is laminated to the dielectric layer 11, it is preferable that the content of the inorganic insulating substance in the third layer 16c is 20% by volume or more and, from the standpoint of allowing the adhesiveness with the wiring conductor 2 and, also, adhesiveness between the third layers 16c to be favorable, it is preferable that the content of the inorganic insulating substance in the third layer 16c is 40% by volume or less.

When the thickness T of such cladding layer 16 is less than 10 µm, the thickness of the third layer 16c comes to be too small as being less than 2 µm whereupon there is a tendency in which the adhesiveness of the cladding layer 16 with the wiring conductor 2 is deteriorated and, when it is more than 10 µm, the thickness of the third layer 16c comes to be more than 20 µm whereupon, when the dielectric layers 11 are laminated, there is a tendency in which a resin flow is likely to be generated in a member, the third layer 16c, causing a deviation of the position thereof. Therefore, it is preferable that the thickness T of the cladding layer 16 is kept to be in an area of from 10 µm to 100 µm.

Further, examples of the inorganic insulating fillers for use in the cladding layer 16 include aluminum oxide, silicon oxide, titanium oxide, barium oxide, strontium oxide, zirconium oxide, calcium oxide, zeolite, silicon nitride, aluminum nitride, silicon carbide, potassium titanate, barium titanate, strontium titanate, calcium titanate, aluminum borate, barium stannate, barium zirconate, strontium zirconate and the like.

Further, as for shapes of the inorganic insulating fillers hereinbefore described, there included are an approximately spherical shape, an acicular shape, a flake shape and other shapes; from the standpoint of a filling property, the approximately spherical shape is preferable and, on this occasion, a particle diameter thereof is from about 0.1 µm to about 15 µm which is smaller than the thickness of the cladding layer 16.

Further, the cladding layer 16 may contain a rubber component for adjusting the Young's modulus thereof, an antioxidant for improving thermal stability, a light stabilizer such as an ultraviolet ray absorber and the like for improving light resistance, a halogen-type or phosphate-type fire retardant for improving fire retardance, a fire retardant aid such as an antimony-type compound, zinc borate, barium metaborate, zirconium oxide and the like, a lubricant such as a higher fatty acid, a higher fatty acid ester, a metallic salt of a higher fatty acid and a fluorocarbon-type surfactant for improving lubricity, or a coupling agent such as a silane-type coupling agent, a titanate-type coupling agent and the like for enhancing affinity with the filler thereby enhancing a bonding property therebetween and mechanical strength thereof.

Such dielectric layer 11 is fabricated such that, after the first layer 16a which becomes a portion of the cladding layer 16 is formed by applying a paste obtained by adding a thermosetting polyphenyleneether resin, a solvent, a plasticizer, a dispersant and the like to inorganic insulating fillers such as silicon oxide and the like having a particle diameter of from about 0.1 µm to about 15 µm such that a content of the inorganic insulating fillers is allowed to be from 60% by volume to 80% by volume after dried on upper and bottom surfaces of the liquid crystal polymer layer 5 by employing a sheet forming method such as a doctor blade method and the like, or, after the first layer 16a is formed on the surface of the liquid crystal polymer layer 5 by first immersing the liquid crystal polymer layer 5 in the paste prepared above and then pulling up the liquid crystal polymer layer 5 from the paste perpendicularly, the thus-formed first layer 16a is heat-dried at a temperature of from 40° C. to 100° C. for from 5 minutes to 3 hours to allow the first layer 16a to be adhered to the surface of the dielectric layer 1, and, subsequently, the second layer 16b in which the content of the inorganic insulating fillers is from 40% by volume to 60% by volume and the third layer 16c in which the content of the inorganic insulating fillers is from 20% by volume to 40% by volume are each individually formed in a same way as in the first layer 16a in this order. Alternatively, a paste which has been obtained by adding a thermosetting polyphenyleneether resin, a solvent, a plasticizer, a dispersant and the like, so as to having 1000–3000 Pa·s viscosity in 1000 s$^{-1}$ in chopping speed, to inorganic insulating fillers such as silicon oxide having a particle diameter of from about 0.1 µm to about 15 µm such that a content of the inorganic insulating fillers is allowed to be from 40% by volume to 60% by volume after dried was applied on upper and bottom surfaces of the liquid crystal polymer layer 5 by employing a sheet forming method such as a known doctor blade method and the like and, then, subjected to first drying processing at a temperature of from 30° C. to 50° C. for from 15 minutes to 60 minutes and, subsequently, subjected to a second drying processing at a temperature of from 60° C. to 100° C. for from 15 minutes to 60 minutes whereby, by allowing the inorganic insulating fillers to be settled down, it is feasible to form a first layer 16a in which the content of the inorganic insulating fillers is from 60% by volume to 80% by volume, a second layer 16b in which the content of the inorganic insulating fillers is from 40% by volume to 60% by volume and a third layer 16c in which the content of the inorganic insulating fillers is from 20% by volume to 40% by volume were formed at the same time on the side of the liquid crystal polymer 5. On this occasion, in each of the layers 16a, 16b and 16c, the thickness and the content of the inorganic insulating fillers can be set to be desired ones by adjusting thickness thereof, and a viscosity and a drying period of time of the paste.

Further, from the standpoint of securing the high thermal resistance, a low hygroscopic property and high dimensional stability, it is preferable that, in the dielectric layer 11, the thickness of the liquid crystal polymer layer 5 is maintained to be from 1 time to 20 times the thickness T of the cladding layer 16.

The wiring conductor 2 is adhere-formed on at least one surface of the upper and bottom surfaces of the dielectric layer 11 in the same way as in the dielectric layer 1 according to the first embodiment.

From the standpoint of preventing a void from being generated in the periphery of the wiring conductor 2 when a plurality of the dielectric layers 11 are laminated with one another, it is preferable that the wiring conductor 2 is embedded such that at least the surface of the wiring conductor 2 and the surface of the cladding layer 16 become flat along the surface of the cladding layer 16. Further, when the wiring conductor 2 is embedded in the cladding layer 16, by maintaining porosity of the cladding layer 16 to be from 3% by volume to 40% by volume on a dry basis, a buildup of the resin of the cladding layer 16 in the periphery of the wiring conductor 2 is not generated so that the dielectric layers 11 can be formed flat and also air which is present in a space between the wiring conductor 2 and the cladding layer 16 can easily be discharged thereby being capable of preventing an air bubble from being entrapped. Further, when the porosity of the cladding layer 16 is more than 40% by volume on a dry basis, after a plurality of the dielectric layers 11 are subjected to a press-heat setting operation, a pore remains in the cladding layer 16 and, on this occasion, the thus-remained pore absorbs moisture in the air whereupon there is a risk of deteriorating the insulating property of the cladding layer 16; therefore, it is preferable that the porosity of the cladding layer 16 is from 3% by volume to 40% by volume on a dry basis.

Such porosity of the cladding layer 16 on a dry basis can be arranged such that the porosity has a predetermined value by appropriately adjusting drying conditions such as a drying temperature, temperature raising rate and the like when the cladding layer 16 is applied on the surface of liquid crystal polymer layer 5 and dried.

Further, from the standpoint of adhesiveness with the cladding layer 16, it is preferable that the wiring conductor 2 is embedded such that the bottom surface of the wiring conductor 2 is positioned in the second layer 16b or the third layer 16c of the cladding layer 16. When the bottom surface of the wiring conductor 2 is positioned in the first layer 16a of the cladding layer 16, since the content of the inorganic insulating fillers in the first layer 16a is as large as from 60% by volume to 80% by volume, the first layer 16a is inferior in adhesiveness whereupon there is a tendency in which a separation at the interface with the wiring conductor 2 is likely to be generated. Therefore, it is important that the bottom surface of the wiring conductor 2 is positioned in the second layer 16b or the third layer 16c of the cladding layer 16 and, particularly, it is preferably positioned in the third layer 16c.

Further, a position of the bottom surface of the wiring conductor 2 can be placed in desired area of the cladding layer 16 by adjusting a pressure of a hot-press operation at the time of metallic foil transfer. Further, in order to enhance adhesiveness of the wiring conductor 2 with the cladding layer 16, it is preferable that the surface of the wiring conductor 2 is beforehand subjected to a polishing operation such as buffing, blasting and brushing, a chemical treatment and the like to allow the surface thereof to be roughened.

According to the multi-layer wiring substrate 14 of the invention, the dielectric layer 11 comprises the cladding layer 16 formed by containing the inorganic insulating fillers in the polyphenyleneether-type organic substance on each of the upper and bottom surfaces of the polymer layer 5, the dielectric constants of the liquid crystal polymer layer 5 and the cladding layer 16 comprising the polyphenyleneether-type organic substance are low and approximately same with each other; accordingly, as well as the excellent transmission characteristics of the multi-layer wiring substrate 14 in a high-frequency region of 100 MHz or more, the frequency behaviors thereof are the same whereupon, even a minor variation of thickness occurs at the time of lamination, the multi-layer wiring substrate 14 which is excellent in high-frequency transmission characteristics such that the transmission characteristics in the high frequency region are not deteriorated can be formed. Further, since the liquid crystal polymer layer 5 has high thermal resistance, high Young's modulus, high dimensional stability and a low hygroscopic property, the dielectric layer 11 can be constructed without using a reinforcing material such as glass cloth. As a result, the drilling processing to be performed by a laser is facilitated to form a fine uniform through hole.

After the through conductor 3 is formed in a desired position of a precursor sheet which will eventually become the dielectric layer 11 by the aforementioned method, a pattern-formed metallic foil of, for example, copper is transferred on the thus-treated precursor sheet by hot-pressing at a temperature of from 100° C. to 200° C. under a pressure of from 0.5 MPa to 10 MPa for from 10 minutes to 1 hour to such multi-layer wiring substrate 14 and, then, a plurality of the thus-prepared sheet are laminated with one another to form a laminate and, thereafter, the thus-prepared laminate is subjected to hot-pressing at a temperature of from 150° C. to 300° C. under a pressure of from 0.5 MPa to 10 MPa for from 30 minutes to 24 hours to achieve a complete setting thereof whereupon such multi-layer wiring substrate 14 is fabricated.

Thus, according to the multi-layer wiring substrate 14 of the invention, since the dielectric layer 11 comprises the cladding layer 16 formed by laminating in order the first layer 16a in which from 60% by volume to 80% by volume of inorganic insulating fillers is contained in the polyphenyleneether-type organic substance, the second layer 16b in which from 40% by volume to 60% by volume of inorganic insulating fillers is contained in the polyphenyleneether-type organic substance and the third layer 16c in which from 20% by volume to 40% by volume of inorganic insulating fillers is contained in the polyphenyleneether-type organic substance, the coefficient of thermal expansion of the first layer 16a which contacts the liquid crystal polymer layer 5 in the cladding layer 16 is approximate to that of the liquid crystal polymer layer 5 and, as a result, there occurs no case in which the crack is generated in the cladding layer 16 even by the temperature cycle test which inherently includes a sharp temperature change whereupon a highly reliable multi-layer wiring substrate 14 can be formed. Further, since the content of the inorganic insulating fillers in the third layer 16c is set to be as small as from 20% by volume to 40% by volume, there neither occurs a case in which the adhesiveness between the cladding layer 16 and the wiring conductor 2 is deteriorated whereby the wiring conductor 2 can not be adhere-formed on the cladding layer 16, nor occurs a case in which, when the dielectric layers 11 are adhered with each other, the adhesiveness between the cladding layers 16 which form the dielectric layer 11 is deteriorated whereby a separation is generated between the dielectric layers 11 to deteriorate the insulating property.

Next, the multi-layer wiring substrate according to the second embodiment of the invention was evaluated by means of a sample fabricated as described below.

EXAMPLE 2

First, spherical fused silica having an average particle diameter of 0.6 μm was added to a thermosetting-type polyphenyleneether resin such that a content thereof becomes 70% by volume on a dry basis to produce a mixture and, then, toluene as a solvent and a catalyst for acceleration of setting of the organic resin were added to the thus-prepared mixture and agitated for one hour to prepare a paste. Subsequently, a surface of a liquid crystal polymer layer having a melting point of 320° C. was subjected to plasma processing to prepare the liquid crystal polymer layer having a thickness of 35 μm and a center line average roughness Ra of 0.10 μm and, then, the paste was coated on an upper surface of the thus-prepared liquid crystal polymer layer by a doctor blade method to form a first layer comprising a thermosetting-type polyphenyleneether having a thickness of about 10 μm on a dry basis. Thereafter, the paste which has been adjusted such that a content of a spherical fused silica therein becomes 50% by volume on a dry basis was coated on the thus-formed first layer in a same manner as described above to form a second layer having a thickness of about 20 μm. Further, the paste which has been adjusted such that the content of the spherical fused silica therein becomes 30% by volume on a dry basis was coated on the thus-formed second layer in the same manner as described above to form a third layer having a thickness of about 10 μm. Further, other first, second and third layers were formed on a bottom surface of the liquid crystal polymer layer to obtain a precursor sheet which will eventually become the dielectric layer.

Next, a through hole having a diameter of 65 μm was formed in this precursor sheet by a $CO_2$ laser and, then, a conductive paste containing copper powders and an organic binder was embedded in this through hole by a screen printing method to form a through conductor.

Further, after a transfer support film attached with a copper foil having a thickness of 12 μm which had been formed in a circuit pattern and the precursor sheet comprising the through conductor formed therein which will eventually becomes a dielectric layer were positioned in registry with each other and applied with a pressure of 3 MPa for 30 seconds in a vacuumized laminating apparatus and, thereafter, the transfer support film was removed therefrom to embed the wiring conductor in the precursor sheet. Lastly, 4 sheets of precursor sheets on which this wiring conductor was formed were laminated with one another, subjected to heating processing at a temperature of 200° C. under a pressure of 3 MPa for 5 hours for a complete setting to obtain the multi-layer wiring substrate.

Further, as for a test substrate for an evaluation of the insulating property, a wiring conductor in a pectinate pattern having a wiring width of 50 μm and a wiring space of 50 μm was formed in the multi-layer wiring substrate, whereas, as for a test substrate for an evaluation of the temperature cycle resistance, formed therein was a viachain by 2 layers of the wiring conductors which are positioned above and below the dielectric layer of the multi-layer wiring substrate, respectively, and a through conductor which electrically connects the 2 layers of the wiring conductors.

Comparative Example 3

A multi-layer wiring substrate which has been used in Comparative Example 3 was fabricated in the same manner as in Example 2, except that a cladding layer having a thickness of 40 μm was formed by coating a paste, which has been adjusted such that a content of the spherical fused silica therein comes to be 50% by volume on a dry basis, on the liquid crystal polymer layer by a doctor blade method.

Further, the thickness of the cladding layer of the multi-layer wiring substrate which has been used for Comparative Example 3 was 40 μm, silica contents in areas of from an interface between the liquid crystal polymer layer and the cladding layer to 10 μm deep, from 10 μm deep to 30 μm deep and from 30 μm deep to 40 μm deep were 51% by volume, 50% by volume and 49% by volume, respectively; on this occasion, the silica content in the cladding layer was nearly uniformly dispersed.

Comparative Example 4

A multi-layer wiring substrate which has been used in Comparative Example 4 was fabricated in the same manner as in Example 2, except that a cladding layer having a thickness of 40 μm by coating a paste, which has been adjusted such that a content of the spherical fused silica therein comes to be 70% by volume on a dry basis, on the liquid crystal polymer layer by a doctor blade method.

Further, the thickness of the cladding layer of the multi-layer wiring substrate which has been used for Comparative Example 4 was 40 μm, silica contents in areas of from an interface between the liquid crystal polymer layer and the cladding layer to 10 μm deep, from 10 μm deep to 30 μm deep and from 30 μm deep to 40 μm deep were 72% by volume, 70% by volume and 68% by volume, respectively; on this occasion, the silica content in the cladding layer was nearly uniformly distributed.

As for the evaluation of the insulating property, a high temperature bias test was executed under conditions of a temperature of 130° C., relative humidity of 85% and applied potential of 5.5 V, insulating resistance between wiring conductors themselves after 300 hours was measured and a variation between measurements before and after the test was examined thereby evaluating the insulating property. Further, as for the evaluation of the temperature cycle resistance, a sample was subjected to the temperature cycle test in which one cycle was set as being −55° C. for 30 minutes plus 125° C. for 30 minutes, the conductive resistance of the viachain after 2000 cycles was measured and a variation between before and after the test was examined to evaluate the insulating property.

Evaluation results of the insulating property and the temperature cycle resistance are shown in Tables 3 and 4, respectively.

TABLE 3

| | Insulating resistance/Ω | | |
|---|---|---|---|
| Sample | Before test | High temperature bias test, after 168 hours | High temperature bias test, after 300 hours |
| Example 2 | $9.8 \times 10^{12}$ | $7.1 \times 10^{11}$ | $2.3 \times 10^{10}$ |
| Comparative Example 3 | $8.9 \times 10^{12}$ | $2.8 \times 10^{10}$ | $3.4 \times 10^{9}$ |
| Comparative Example 4 | $6.7 \times 10^{12}$ | $6.1 \times 10^{7}$ | $2.9 \times 10^{5}$ |

TABLE 4

| | Conductive resistance/Ω | | |
|---|---|---|---|
| Sample | Before test | Temperature cycle test, after 1000 cycles | Temperature cycle test, after 2000 cycles |
| Example 2 | 7.4 | 7.5 (conversion 1%) | 7.6 (conversion 3%) |
| Comparative Example 3 | 7.5 | 7.8 (conversion 4%) | 9.1 (conversion 21%) |
| Comparative Example 4 | 7.1 | 7.2 (conversion 1%) | 7.4 (conversion 4%) |

From Table 3, since the insulating resistance after 300 hours of the high temperature bias test becomes as extremely small as $2.9 \times 10^{5} \Omega$, the multi-layer wiring substrate of Comparative Example 4 was found to be inferior in thermal resistance. Further, from Table 4, since a rate of change of the conductive resistance after 2000 cycles of the temperature cycle test became 21%, the multi-layer wiring substrate of Comparative Example 3 was found to be inferior in temperature cycle resistance.

On the other hand, the multi-layer wiring substrate according to the invention was excellent such that the insulating resistance was as large as $2.3 \times 10^{10} \Omega$ even after 300 hours of the high temperature bias test and the rate of change even after 2000 cycles of the temperature cycle test was as small as 3%.

Third Embodiment

Figure 5:
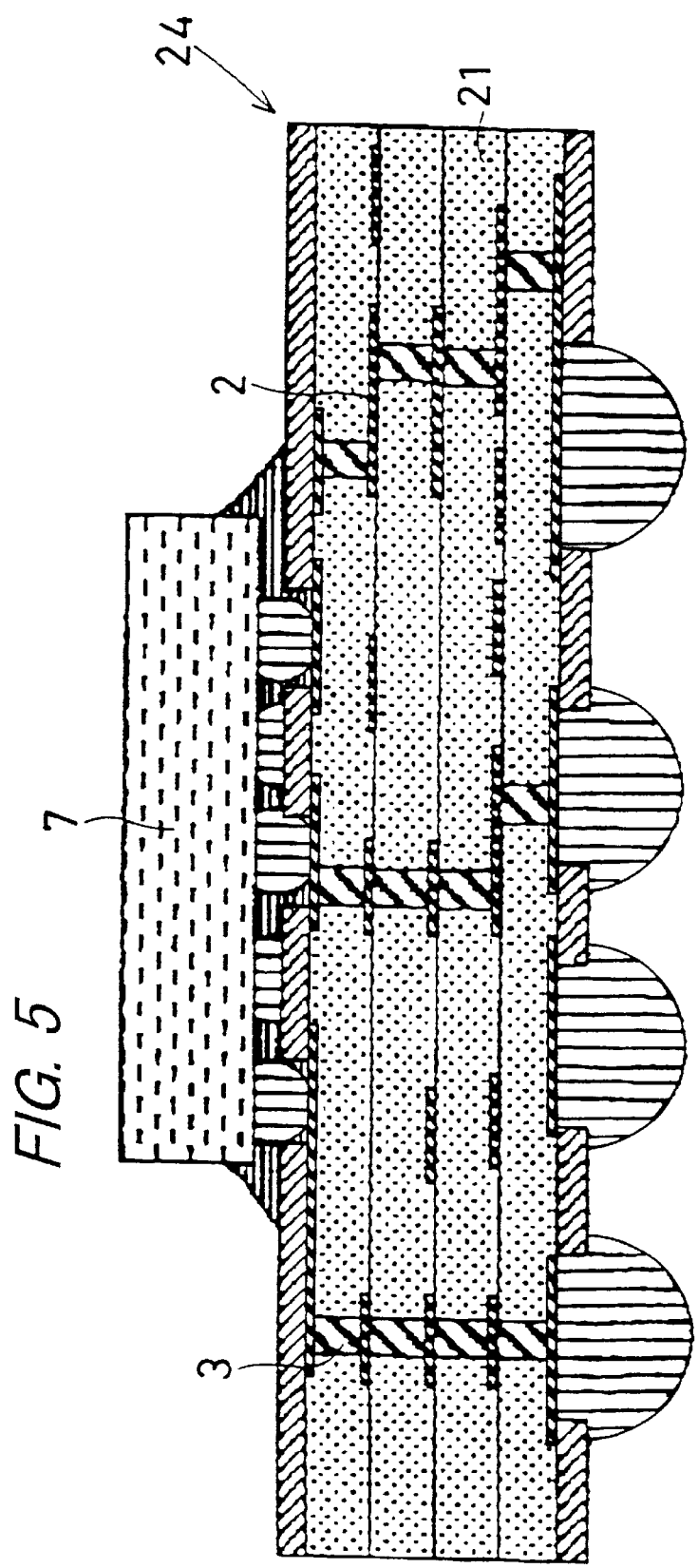
FIG. 5 is a cross-sectional view of a mixed integrated circuit comprising a semiconductor device mounted on a multi-layer wiring substrate according to a third embodiment of the invention.
Figure 6:
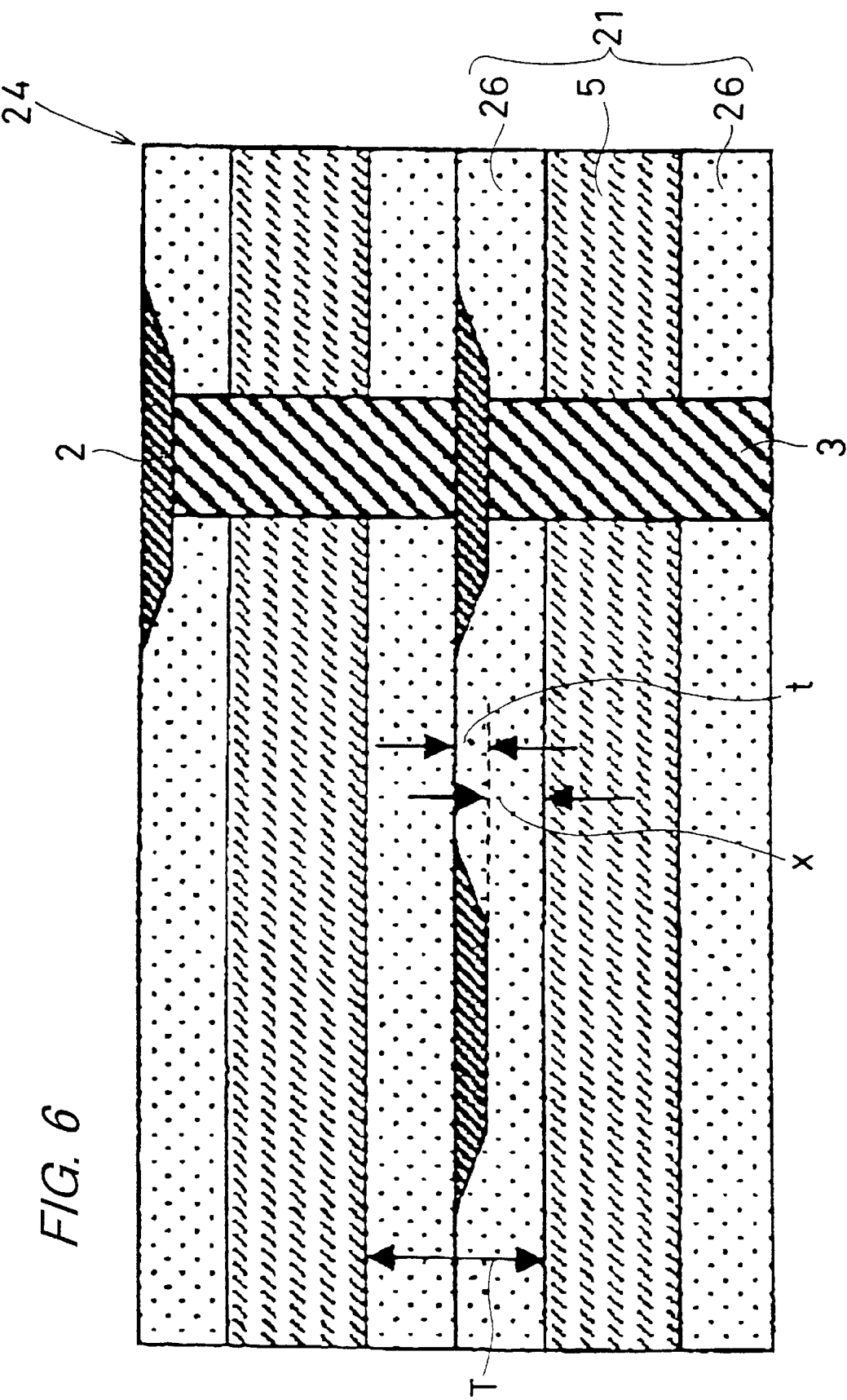
FIG. 6 is an enlarged cross-sectional view of a substantial portion of the multi-layer wiring substrate according to the third embodiment of the invention.

FIG. 5 is a cross-sectional view of a mixed integrated circuit comprising a semiconductor device mounted on a multi-layer wiring substrate according to a third embodiment of the present invention and FIG. 6 is a enlarged cross-sectional view of a substantial portion of the multi-layer wiring substrate shown in FIG. 5. In this embodiment, parts corresponding to the above-mentioned embodiment are denoted same numerals and explanations with respect to them are omitted. In these figures, reference numerals 21, 2 and 3 denote a dielectric layer, a wiring conductor and a through conductor, respectively and a multi-layer wiring substrate 24 according to the invention is primarily constructed by these portions. Further, in the present embodiment, the multi-layer wiring substrate 24 comprising 4 layers of the dielectric layers 21 laminated with one another is shown for an illustrative purpose only and by no means for limiting it.

The dielectric layer 21, which comprises a liquid crystal polymer layer 5 and a cladding layer 6 adhere-formed thereon comprising a polyphenyleneether-type organic substance and organic substance which has lower Young's modulus than that of the ether-type organic substance, functions as a support for an electronic component 7 mounted on the multi-layer wiring substrate 24 and the wiring conductor 2.

In the multi-layer wiring substrate 24 according to the invention, it is preferably that the liquid crystal polymer layer 5 is formed such that, from the standpoint of temperature cycle reliability, soldering thermal resistance and processability, the coefficient of thermal expansion in a layer direction is from −20 ppm/° C. to 20 ppm/° C., Young's modulus is 2 GPa or more and a melting point is from 200° C. to 400° C. When, in the liquid crystal polymer layer 5, the coefficient of thermal expansion is less than −20 ppm/° C., the difference of the coefficient of thermal expansion between the liquid crystal polymer layer 5 and the cladding layer 26 becomes large whereupon there is a tendency in which a crack is likely to be generated in the cladding layer 26, whereas, when the coefficient of thermal expansion is more than 20 ppm/° C., the difference of the coefficient of thermal expansion between the dielectric layer 21 and the wiring conductor layer 2 becomes large whereupon there is a tendency in which a crack is likely to be generated in the vicinity of the wiring conductor 2. Further, when the Young's modulus is less than 2 GPa, the camber strength of the dielectric layer 21 becomes small, there is a tendency in which a camber is likely to be generated in the multi-layer wiring substrate 24. Therefore, it is preferable that, in the liquid crystal polymer layer 5, the coefficient of thermal expansion in a layer direction is from −20 ppm/° C. to 20 ppm/° C., and the Young's modulus is 2 GPa or more, and, particularly, from the standpoint of the connection reliability in a case in which the electronic components 7 has been mounted, it is preferable that coefficient of thermal expansion is from −10 ppm/° C. to 10 ppm/° C. and the melting point is from 250° C. to 350° C.

It is preferable that, in order to enhance adhesiveness of the liquid crystal polymer layer 5 to the cladding layer 26 comprising the polyphenyleneether-type organic substance and organic substance which has lower Young's modulus than that of the ether-type organic substance, a surface of the liquid crystal polymer layer 5 is subjected to polishing by, for example, buffing, blasting and brushing, processing by, for example, plasma, corona, ultraviolet ray and chemicals whereupon the surface thereof is roughened such that the center line average roughness Ra has a value of from 0.05 µm to 5 µm. It is preferable that the center line average roughness Ra has a value of 0.05 µm or more from the standpoint of prevention of separation of the liquid crystal polymer layer 5 from the cladding layer 26 by the soldering reflow to be performed and, further, has a value of 5 µm or less from the standpoint of prevention of entraining of air when the cladding layer 26 is formed.

Next, the cladding layer 26 not only functions as an adhesive when the wiring conductor 2 is adhere-formed on the dielectric layer 21, but also functions as an adhesive when the dielectric layers 21 are laminated with each other. Such cladding layer 26 comprises the polyphenyleneether-type organic substance and another organic substance having a lower Young's modulus than that of the former organic substance whereupon it is preferable that the Young's modulus in a layer direction is from 0.2 GPa to 1.5 GPa. The features described above are important.

According to the multi-layer wiring substrate 24 of the invention, since the dielectric layer 21 comprises the cladding layer 26, comprising the polyphenyleneether-type organic substance and another organic substance having a lower Young's modulus than that of the former organic substance, formed on the liquid crystal polymer layer 5, it becomes feasible to drill-provide a fine through hole and, as a result, the multi-layer wiring substrate 24 having a high-density wiring can be formed. Further, since dielectric constants of the liquid crystal polymer layer 5 and the cladding layer 26 are approximately same with each other, frequency behaviors of both layers become the same to each other thereby forming the multi-layer wiring substrate 24 which is excellent in the high frequency characteristics such that transmission characteristics in the high frequency region are not deteriorated regardless of a minor variation of thickness to be possibly generated at the time of lamination.

Further, from 20% by volume to 80% by volume of polyphenyleneether-type organic substance is contained in the cladding layer 26; on this occasion, examples of the polyphenyleneether-type organic substances include a polyphehylene ether resin, a derivative thereof, a polymer alloy and the like. Among other things, from the standpoint of the thermal cycle reliability and the position accuracy at the time of lamination, it is preferable that a thermal setting-type polyphenyleneether such as an allyl-modified polyphenyleneether and the like are contained. Further, when the content of the polyphenyleneether-type organic substance is less than 20% by volume, there is a tendency in which a kneading property is deteriorated, whereas, when it is more than 80% by volume, there is a tendency in which a variance of the thickness of the cladding layer 26 becomes large at the time of forming the cladding layer 26 on the surface of the liquid crystal polymer layer 5. Therefore, it is preferable that the content of the polyphenyleneether-type organic substance is in a range from 20% by volume to 80% by volume.

Further, according to the multi-layer wiring substrate 24 of the invention, since the Young's modulus of the cladding layer 26 in a direction of layers is set to be from 0.2 GPa to 1.5 GPa, when the cladding layer 26 containing the polyphenyleneether-type organic substance having a relatively large coefficient of thermal expansion is subjected to thermal expansion or thermal contraction by a temperature change, due to the fact that the Young's modulus of this cladding layer 26 is as low as from 0.2 GPa to 1.5 GPa, the thermal expansion and the thermal contraction of the cladding layer 26 are bound with the liquid crystal polymer layer 5 having a small coefficient of thermal expansion and a high Young's modulus to allow the thermal expansion and thermal contraction of the cladding layer 26 to be small. As a result, no crack is generated in the cladding layer 26 even by a temperature cycle test which includes a sharp temperature change. Further, since it is not necessary to highly densely load the cladding layer 26 with the inorganic insulating fillers, it is feasible that adhesiveness between the cladding layers 26 themselves becomes favorable and, at the same time, there occurs no case in which a separation occurs between the dielectric layers 21 themselves to deteriorate the insulating property thereof.

When the Young's modulus of the cladding layer 26 is less than 0.2 GPa, rigidity of the multi-layer wiring substrate 24 becomes small and a camber is generated in the multi-layer wiring substrate 24 whereupon there is a tendency in which a wiring failure occurs in the wiring conductor layer 2. Further, when the Young's modulus of the cladding layer 26 is more than 1.5 GPa, there is a tendency in which it becomes difficult that the liquid crystal polymer layer 5 binds the cladding layer 26 at a high temperature; as a result, the liquid crystal polymer layer 5 is expanded whereby the thermal expansion of the multi-layer wiring substrate 24 becomes large and, on this occasion, there is a tendency in which a wiring failure at a joint portion of the electronic components 7 is generated. Therefore, it is preferable that the Young's modulus of the cladding layer 26 is from 0.2 GPa to 1.5 GPa, and favorably from 0.7 GPa to 1.2 GPa.

Further, the cladding layer 26 contains from 5% by volume to 60% by volume of the organic substance having a lower Young's modulus than that of the polyphenyleneether-type organic substance; this feature is important.

According to the multi-layer wiring substrate 24 of the invention, since the cladding layer 26 contains from 5% by volume to 60% by volume of the organic substance having a lower Young's modulus than that of the polyphenyleneether-type organic substance, it is feasible that the Young's modulus of the cladding layer 26 can easily be set in a range of from 0.2 GPa to 1.5 GPa. Further, when the content of the organic substance having a lower Young's modulus than that of the polyphenyleneether-type organic substance is less than 5% by volume, there is a tendency in which an effect to lower the Young's modulus of the cladding layer 26 is difficult to be expressed. Further, when it is more than 60% by volume, the Young's modulus of the cladding layer 26 becomes too low whereupon the multi-layer wiring substrate 24 becomes soft to cause a camber and, as a result, there is a tendency in which the wiring failure is generated in the conductor layer 2. Therefore, it is preferable that the content of the organic substance having a lower Young's modulus than that of the polyphenyleneether-type organic substance in the cladding layer 26 is from 5% by volume to 60% by volume and, most favorably, from 20% by volume to 40% by volume.

As for such organic substance having a lower Young's modulus than that of the polyphenyleneether-type organic substance, used is a resin or rubber-type elastomer having a Young's modulus of 1 GPa or less. Examples of such resins or elastomers include natural rubber, polybutadiene, polyisoprene, polyisobutylene, neoprene, polysulfide rubber, Thiokol rubber, acrylic rubber, polyurethane rubber, silicone rubber, epichlorohydrin rubber, styrene-butadiene block copolymer (SBR), hydrogenated styrene-butadiene block copolymer (SEB, SEBC), styrene-butadiene-styrene block copolymer (SBS), hydrogenated styrene-butadiene-styrene block copolymer (SEBS), styrene-isoprene block copolymer (SIR), hydrogenated styrene-isoprene block copolymer (SEP), styrene-isoprene-styrene block copolymer (SIS), hydrogenated styrene-isoprene-styrene block copolymer (SEPS), ethylene propylene rubber (EPR), ethylene-propylene-diene rubber (EPDM), a core shell-type granular elastomer such as butadiene-acrylonitrile-styrene-core shell rubber (ABS), methyl methacrylate-butadiene-styrene-core shell rubber (MBS), methyl methacrylate-butyl acrylate-styrene-core shell rubber (MAS), octyl acrylate-butadiene-styrene-core shell rubber (MABS), alkyl acrylate-butadiene-acrylonitrile-styrene-core shell rubber (AABS), butadiene-styrene-core shell rubber (SBR), a core shell rubber containing a siloxane, for example, methyl methacrylate-butyl acrylate-siloxane and the like, and modified rubber thereof and the like.

Further, these organic substances having a low Young's modulus may be modified by using a modifier having a polar group such as maleic acid anhydride, epoxy and the like. Further, these organic substances having a low Young's modulus may each individually be used or may be used in a combination of 2 members or more.

Further, in the multi-layer wiring substrate 24 of the invention, it is preferable that the organic substance having a low Young's modulus contains from 20% by volume to 80% by volume of a styrene-type organic substance. According to the multi-layer wiring substrate 24, since the styrene-type organic substance has a low dielectric constant and low dielectric tangent, the multi-layer wiring substrate 24 which is excellent in transmission characteristics even at a high frequency of 100 MHz or more can be formed.

Such organic substances having a low Young's modulus containing a styrene-type organic substance are organic substances having styrene as a monomer unit in the molecular structure thereof; among other things, SBR, SEB, SEBC, SBS, SEBS, SIR, SEP, SIS, SEPS or another substance having a low Young's modulus which is derived from these members by modification is particularly used.

Further, when the content of the styrene-type organic substance is less than 20% by volume, since the dielectric constant and the dielectric tangent become large, there is a tendency in which the transmission characteristics in a high frequency region of 100 MHz or more are deteriorated. When it is more than 80% by volume, since the Young's modulus of the organic substance having a low Young's modulus becomes large, there is a tendency in which it becomes difficult to maintain the Young's modulus of the cladding layer 26 in a desired range. Therefore, it is preferable that the content of the styrene-type organic substance is from 20% by volume to 80% by volume.

Further, from the standpoint of allowing the adhesiveness of the cladding layer 26 with the liquid crystal polymer layer 5, the wiring conductor 2 or the through conductor 3 to be favorable, it is preferable that the cladding layer 26 contains a additive such as a multi-functional monomer and a multi-functional polymer which each have 2 or more of polymerizable functional groups in the same was as in the cladding layers 6 and 16 according to the first and second embodiments; on this occasion, it is preferable that the cladding layer 26 contains, for example, triallyl cyanulate triallyl isocyanurate, polymers thereof and the like.

Further, when the dielectric layers 21 are laminated with one another and the resultant laminate is pressed, from the standpoint of suppressing the flow property of the cladding layer 26, preventing deviation of the position of the through conductor 3 and variance of the thickness of the cladding layer 26, it is preferable that the cladding layer 26 contains 10% by volume or more of inorganic insulating fillers as a filler. Further, from the standpoint of preventing a separation at an interface with the liquid crystal polymer layer 5 or the wiring conductor 2 at the time of soldering reflow, it is preferable that the content of the filler is 70% by volume or less. Therefore, it is preferable that from 10% by volume to 70% by volume of the filler is contained in the cladding layer 26.

Further, from the standpoint of securing the insulating reliability, it is preferable that the thickness of the dielectric layer 21 is from 10 μm to 200 μm; on this occasion, from the standpoint of allowing the adhesiveness with the wiring conductor 2 to be favorable, it is preferable that the total thickness of the cladding layer 26 is 10% or more of that of the dielectric layer 21. Further, from the standpoint of securing high thermal resistance, a low hygroscopic property and high dimensional stability, it is preferable that the total thickness of the cladding layer 26 is 70% or less of that of the dielectric layer 21. Therefore, it is preferable that the total thickness of the cladding layer 26 is from 10% to 70% of that of the dielectric layer 21.

Such dielectric layer 21 is fabricated such that, after the cladding layer 26 is formed by applying a paste obtained by adding a thermosetting polyphenyleneether resin, an organic substance having a lower Young's modulus than that of this resin, a solvent, a plasticizer, or a dispersant to inorganic insulating fillers such as silicon oxide having a particle diameter of from about 0.1 μm to about 15 μm on upper and bottom surfaces of the liquid crystal polymer layer 5 by employing a sheet forming method such as a doctor blade method and the like, or after the cladding layer 26 is formed on the surface of the liquid crystal polymer layer 5 by first immersing the liquid crystal polymer layer 5 in the paste prepared above and then pulling up the liquid crystal polymer layer 5 from the paste perpendicularly, the thus-formed cladding layer 26 is heat-dried at from 60° C. to 100° C. for from 5 minutes to 3 hours.

The wiring conductor 2 is adhere-formed on at least one surface of the upper and bottom surfaces of the dielectric layer 21 in the same manner as in the dielectric layers 1 and 11 according to the first and second embodiments.

From the standpoint of preventing a void from being generated in the periphery of the wiring conductor 2 when a plurality of the dielectric layers 21 are laminated with one another, it is preferable that the wiring conductor 2 is embedded such that at least the surface of the wiring conductor 2 and the surface of the cladding layer 26 become flat along the surface of the cladding layer 26. Further, when the wiring conductor 2 is embedded in the cladding layer 26, by maintaining porosity of the cladding layer 26 to be from 3% by volume to 40% by volume on a dry basis, a buildup of the resin of the cladding layer 26 in the periphery of the wiring conductor 2 is not generated so that the dielectric layers 21 can be formed flat and also air which is present in a space between the wiring conductor 2 and the cladding layer 26 can easily be discharged thereby being capable of preventing an air bubble from being entrapped. Further, when the porosity of the cladding layer 26 is more than 40% by volume on a dry basis, after a plurality of the dielectric layers 21 are subjected to a press-heatsetting operation, a pore remains in the cladding layer 26 and, on this occasion, the thus-remained pore absorbs moisture in the air whereupon there is a risk of deteriorating the insulating property of the cladding layer 26; therefore, it is preferable that the porosity of the cladding layer 16 is from 3% by volume to 40% by volume on a dry basis.

Such porosity of the cladding layer 26 on a dry basis can be arranged such that the porosity has a predetermined value by appropriately adjusting drying conditions such as a drying temperature, temperature raising rate and the like when the cladding layer 26 is applied on the surface of liquid crystal polymer layer 5 and dried.

Further, in the same manner, it is preferable that the thickness of the cladding layer 26 positioned between the wiring conductor 2 and the liquid crystal polymer layer 5 is set to be from 3 μm to 35 μm. The effect to be exerted by these features is same as in the first embodiment so that an explanation thereon is omitted for the sake of simplicity.

According to the multi-layer wiring substrate 24 of the invention, since the dielectric layer 21 comprises the cladding layer 26, formed on the upper and bottom surfaces of the liquid crystal polymer layer 5, which comprises the polyphenyleneether-type organic substance and another organic substance which has a lower Young's modulus than that of the former organic substance, the liquid crystal polymer layer 5 has high thermal resistance, high Young's modulus, high dimensional stability and a low hygroscopic property whereupon the dielectric layer 21 can be constructed without using a reinforcing material such as glass cloth and, as a result, the drilling processing to be performed by a laser is facilitated to form a fine uniform through hole.

After the through conductor 3 is formed in a desired position of a precursor sheet which will eventually become the dielectric layer 21 by the aforementioned method, a pattern-formed metallic foil of, for example, copper is transferred on the thus-treated precursor sheet by hot-pressing at a temperature of from 100° C. to 200° C. under a pressure of from 0.5 MPa to 10 MPa for from 10 minutes to 1 hour to such multi-layer wiring substrate 24 and, then, a plurality of the thus-prepared sheet are laminated with one another to form a laminate and, thereafter, the thus-prepared laminate is subjected to hot-pressing at a temperature of from 150° C. to 300° C. under a pressure of from 0.5 MPa to 10 MPa for from 30 minutes to 24 hours to achieve a complete setting thereof whereupon such multi-layer wiring substrate 14 is fabricated.

Thus, according to the multi-layer wiring substrate 24 of the invention, the dielectric layer 21 comprises the cladding layer 26 comprising the polyphenyleneether-type organic substance and another organic substance which has a lower Young's modulus than the former organic substance formed on the surface of the liquid crystal polymer layer 5 whereupon, in the liquid crystal polymer layer 5, the coefficient of thermal expansion in a direction of layers is from −20 ppm/° C. to 20 ppm/° C., the Young's modulus is 2 GPa or more and, further, in the cladding layer 26, the Young's modulus in a direction of layers is from 0.2 GPa to 1.5 GPa; hence, the multi-layer wiring substrate 24 which not only has a high-density wiring but also is excellent in soldering thermal resistance, an insulating property, high-frequency transmission characteristics and a thermal cycle property can be formed.

Fourth Embodiment

Figure 7:
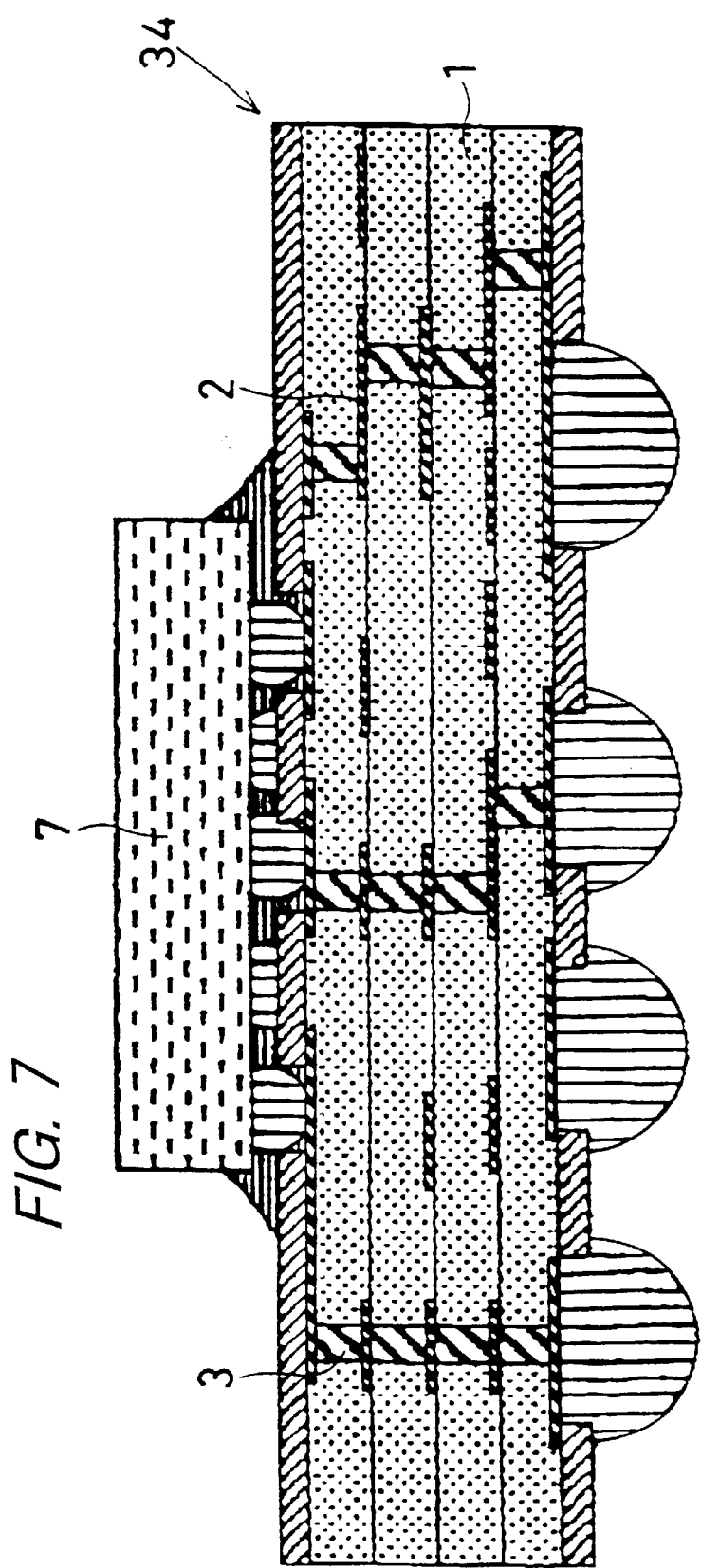
FIG. 7 is a cross-sectional view of a mixed integrated circuit comprising a semiconductor device mounted on a multi-layer wiring substrate according to a fourth embodiment of the invention.
Figure 8:
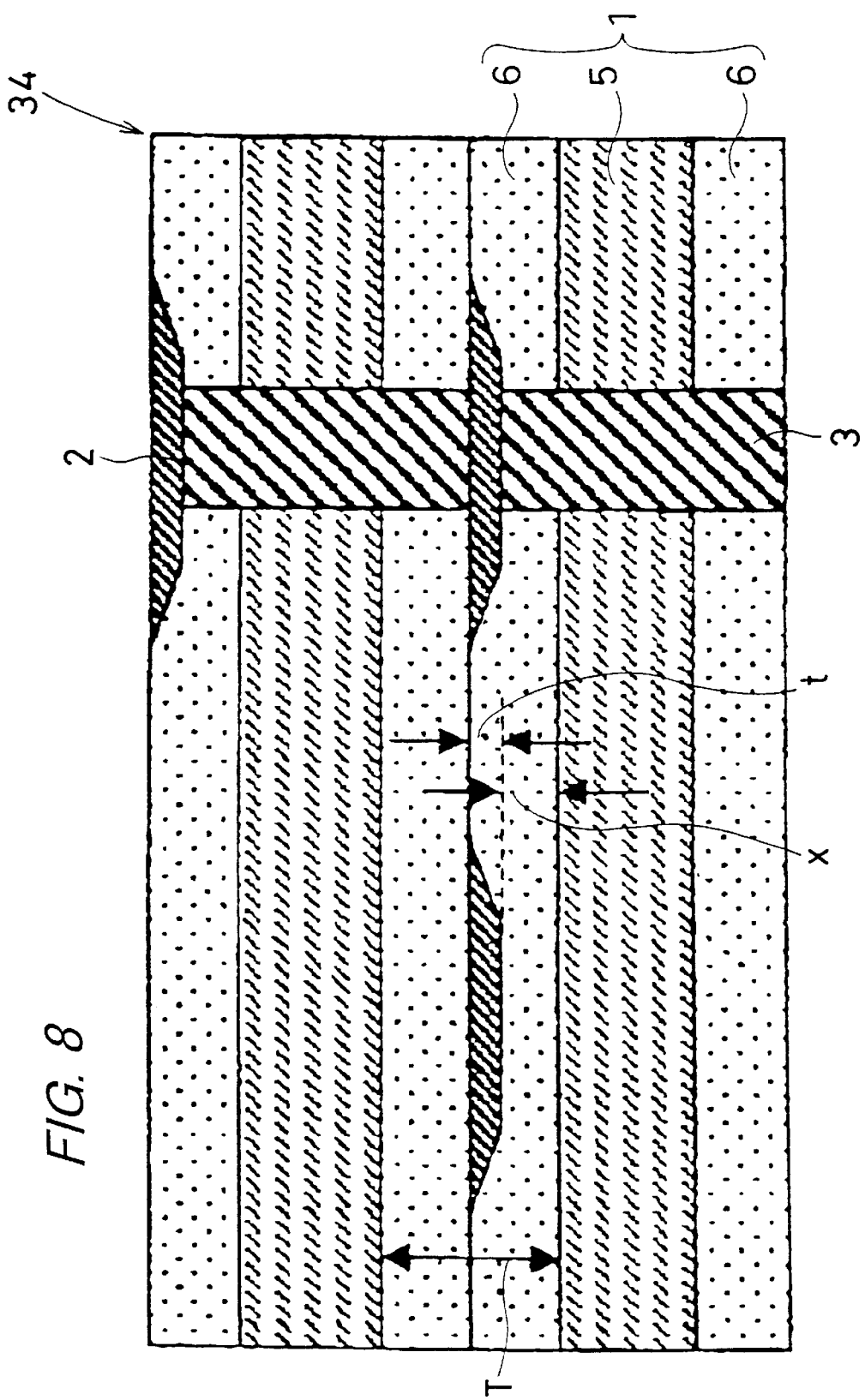
FIG. 8 is an enlarged cross-sectional view of a substantial portion of the multi-layer wiring substrate shown in FIG. 7.

FIG. 7 is a cross-sectional view of a mixed integrated circuit comprising an electronic component such as a semiconductor device and the like mounted on a multi-layer wiring substrate according to a fourth embodiment of the invention, while FIG. 8 is an enlarged cross-sectional view of a substantial portion of the multi-layer wiring substrate shown in FIG. 7. In the present embodiment, constituents corresponding to those of the embodiment described above are denoted by the same reference numerals and the detailed description thereof is omitted. In FIGS. 7 and 8, reference numerals 1, 2 and 3 denote a dielectric layer, a wiring conductor and a through conductor, respectively, and the multi-layer wiring substrate 34 according to the invention is primarily constituted by these constituents. Further, in the present embodiment, as an exemplary illustration, shown is the multi-layer wiring substrate 34 comprising a lamination of four dielectric layers 1.

The dielectric layer 1 is constituted by the liquid crystal polymer layer 5 and a cladding layer 6 comprising the polyphenyleneether-type organic substance formed on the upper and bottom surfaces of the liquid crystal polymer layer and functions as a support of the electronic component 7 and the wiring conductor 2 which are mounted on the multi-layer wiring substrate 34.

In the multi-layer wiring substrate 34 according to the present embodiment, it is important that, in order to enhance adhesiveness to the cladding layer 6 comprising the polyphenyleneether-type organic substance, a surface of the liquid crystal polymer layer 5 is roughened by polishing processing, such as, buffing, blasting and brushing, or other processing such as, plasma processing, corona processing, ultraviolet ray processing, a chemical treatment and the like so that the contact angle thereof against the triallyl isocyanurate becomes from 3° to 50°.

Since the wetting property of the polyphenyleneether-type organic substance to the liquid crystal polymer layer 5 and that of liquid triallyl isocyanurate are approximate to each other and also the contact angle of the liquid crystal polymer layer 5 against triallyl isocyanurate is set to be from 3° to 50°, the cladding layer 6 comprising the polyphenyleneether-type organic substance is well compatible with the surface of the liquid crystal polymer layer 5 whereupon adhesiveness between the liquid crystal polymer layer 5 and the cladding layer 6 comprising the polyphenyleneether-type organic substance can be strong and, as a result, the dielectric layer 1 which does not generate a separation by the thermal shock test such as the temperature cycle test and the like can be formed.

Further, when the contact angle of the liquid crystal polymer layer 5 against triallyl isocyanurate is less than 3°, the cladding layer 6 excessively spreads over the surface of the liquid crystal polymer layer 5 whereupon a position accuracy of the cladding layer 6 is deteriorated. As a result, at the time when a plurality of dielectric layers 1 are stacked, heated and applied with pressure to allow them to be in a multi-layer form, there is a tendency in which a position of the wiring conductor 2 to be formed on the surface of the dielectric layer 1 or the through conductor 3 to be formed therein is deviated from the right position thereby likely causing a wiring failure. Further, it is preferable that, from a standpoint of preventing the separation between the liquid crystal polymer layer 5 and the cladding layer 6 from being generated at the time of the thermal shock test such as a temperature cycle test and the like, the contact angle is 50° or less. Therefore, the contact angle of the liquid crystal layer 1 against triallyl isocyanurate is in a range of 3° to 50°.

Such a dielectric layer 1 is fabricated in such a way that, after the cladding layer 6 is formed by applying a paste obtained by adding a thermosetting polyphenyleneether resin, a solvent, a plasticizer, a dispersant or the like to inorganic insulating fillers such as silicon oxide having a particle diameter of about 0.1 $\mu$m to about 15 $\mu$m or the like on the upper and bottom surfaces of the liquid crystal polymer layer 5, which have been subjected to plasma processing or the like so that the contact angle thereof against triallyl isocyanurate becomes from 3° to 50°, by employing a sheet forming method such as a conventionally known doctor blade method and the like, or after the cladding layer 6 is formed on the surface of the liquid crystal polymer layer 5 by first immersing the liquid crystal polymer layer 5 in the paste prepared above and then pulling up the liquid crystal polymer layer 5 from the paste vertically, the thus-formed cladding layer 6 is heat-dried at 60° C. to 100° C. for 5 minutes to 3 hours.

According to the multi-layer wiring substrate 34 of the invention, the dielectric layer 1 comprises the cladding layers 6 comprising the polyphenyleneether-type organic substance formed on the upper and bottom surfaces of the liquid crystal polymer layer 5; on this occasion, since a molecule of the polyphenyleneether-type organic substance is not so rigid as that of the liquid crystal polymer and also does not exhibit a regular orientation, the former molecule is relatively easily movable and, as a result, even in a case in which the dielectric layers 1 are allowed to be in a multi-layer form, adhesiveness of the dielectric layers 1 among themselves becomes favorable whereupon a multi-layer wiring substrate 34 in which a separation of the dielectric layers 1 from one another to cause an insulation deficiency does not occur at a high temperature bias test can be fabricated. Further, since dielectric constant of the liquid crystal polymer layer 5 and that of the cladding layer 6 comprising the polyphenyleneether-type organic substance are substantially the same with each other, frequency behaviors of both layers are the same with each other thereby forming the multi-layer wiring substrate 34 which is excellent in high frequency transmission characteristics that do not deteriorate transmission characteristics in a high frequency region regardless of a minor variation of thickness to be possibly generated at the time of lamination. Further, when the dielectric layer 1 is allowed to be in a multi-layer form, since the molecule of the polyphenyleneether-type organic substance is movable, molecules of the polyphenyleneether-type organic substance are likely entangled with each other whereupon adhesiveness of the cladding layers 1 thereamong becomes strong and, as a result, the separation between the dielectric layers 1 from one another to cause an insulation deficiency does not occur even at the high temperature bias test. The liquid crystal polymer layer 5 may be employed in any of the first embodiment to the third embodiment.

Next, the multi-layer wiring substrate according to the fourth embodiment of the invention was evaluated with reference to the samples fabricated as described below.

EXAMPLE 3

First, spherical fused silica having an average particle diameter of 0.6 $\mu$m was added to a thermosetting-type polyphenyleneether resin so that a content thereof becomes 40% by volume to produce a mixture and, then, toluene as a solvent and a catalyst for acceleration of setting of the organic resin were added to the thus-prepared mixture, which was agitated for one hour to prepare a varnish. Subsequently, surfaces of a liquid crystal polymer layer having a melting point of 320° C. and a thickness of 35 $\mu$m were subjected to plasma processing to allow the surface to have a contact angle with triallyl isocyanurate of 35° and, then, the thus-prepared varnish was coated on an upper surface of the thus-plasma processed surfaces of the liquid crystal polymer layer by a doctor blade method to form a cladding layer comprising a thermosetting-type polyphenyleneether having a thickness of about 20 $\mu$m in a dry state. Thereafter, another cladding layer comprising the polyphenyleneether was also formed on a bottom surface of the thus-plasma processed surfaces of the liquid crystal polymer layer in a same manner as described above to fabricate a dielectric layer.

Further, a through hole having a diameter of 65 µm was formed in this dielectric layer by a $CO_2$ laser and, then, a conductive paste containing copper powders and an organic binder was embedded in this through hole by a screen printing method to form a through conductor.

Next, after a transfer support film attached with a copper foil having a thickness of 12 µm which had been formed in a circuit pattern and the dielectric layer comprising the through conductor formed therein were positioned in registry with each other and applied with a pressure of 3 MPa for 30 seconds in a vacuumized laminating apparatus and, thereafter, the transfer support film was removed therefrom to embed the wiring conductor on the dielectric layer. Lastly, 4 sheets of the dielectric layers on which this wiring conductor was formed were stacked with one another and subjected to heating processing at a temperature of 200° C. under a pressure of 3 MPa for 5 hours for a complete setting to obtain the multi-layer wiring substrate.

Further, as for a test substrate for an evaluation of the insulating property, a wiring conductor in a pectinate pattern having a wiring width of 50 µm and a wiring space of 50 µm was formed in the multi-layer wiring substrate and, furthermore, as for a test substrate for an evaluation of circuit conductivity, formed therein was a viachain by 2 layers of the wiring conductors which are positioned opposite to each other with the dielectric layer in between so that they are positioned above and below the dielectric layer of the multi-layer wiring substrate, respectively, and a through conductor which electrically connects 2 layers of the wiring conductors and, still further, as for a test substance for an evaluation of the high frequency transmission characteristics, a wiring conductor having a strip line structure was formed in the multi-layer wiring substrate.

Comparative Example 5

A multi-layer wiring substrate for use in Comparative Example 5 was fabricated by firstly forming a wiring conductor in a circuit pattern on a liquid crystal polymer layer having a copper foil heat-fused on a surface thereof and having a melting point of 320° C. by using photoresist and, then, forming a through hole having a diameter of 65 µm by using a $CO_2$ laser and, further, forming a through conductor by embedding a conductive paste containing copper powders and an organic binder in the thus-formed through hole by screen printing thereby forming a circuit substrate and, thereafter, sandwiching the liquid crystal polymer layer having a melting point of 280° C. by the thus-formed circuit substrates to form a laminate and, lastly, heat-pressing the thus-formed laminate at a temperature of 285° C. under a pressure of 1 MPa for 5 minutes.

Comparative Example 6

A multi-layer wiring substrate for use in Comparative Example 6 was fabricated in the same manner as in the multi-layer wiring substrate for use in Comparative Example 1 except for using a liquid crystal polymer layer having a copper foil adhered to a surface thereof via epoxy resin-type adhesive and having a melting point of 320° C.

As for the evaluation of the insulating property, a high temperature bias test was executed under conditions of a temperature of 130° C., relative humidity of 85% and applied potential of 5.5 V, insulating resistance between wiring conductors after 168 hours was measured and a variation between measurements before and after the test was examined. Further, as for the evaluation of the circuit conductivity, a sample was subjected to the temperature cycle test in which one cycle was set as being −55° C. for 30 minutes plus 125° C. for 30 minutes, the conductive resistance of the viachain after 1000 cycles was measured and a variation between before and after the test was examined to evaluate the circuit conductivity. Further, as for the evaluation of the high frequency transmission characteristics, the transmission characteristics in a frequency region of 100 MHz to 40 GHz were measured using a sample having a strip structure.

Evaluation results of the insulating property, evaluation results of the circuit conductivity and evaluation results of the transmission characteristics are shown in Tables 5, 6 and 7, respectively.

TABLE 5

| | Insulating resistance/Ω | |
|---|---|---|
| Sample | Before test | After high temperature bias test |
| Example 3 | $9.5 \times 10^{12}$ | $4.3 \times 10^{10}$ |
| Comparative Example 5 | $8.6 \times 10^{12}$ | $3.5 \times 10^{6}$ |
| Comparative Example 6 | $8.4 \times 10^{12}$ | $8.2 \times 10^{8}$ |

TABLE 6

| | Conductive resistance/Ω | |
|---|---|---|
| Sample | Before test | After temperature cycle test |
| Example 3 | 7.5 | 7.8 (Rate of change 4%) |
| Comparative Example 5 | 8.6 | Wiring failure |
| Comparative Example 6 | 7.4 | 8.8 (Rate of change 19%) |

TABLE 7

| | Transmission characteristics/dB · cm$^{-1}$ | | | |
|---|---|---|---|---|
| Sample | 100 MHz | 1 GHz | 20 GHz | 40 GHz |
| Example 3 | −0.01 | −0.05 | −0.22 | −0.51 |
| Comparative Example 5 | −0.01 | −0.04 | −0.20 | −0.51 |
| Comparative Example 6 | −0.05 | −0.26 | −1.02 | −2.08 |

From Table 5, since, in the multi-layer wiring substrate in Comparative Example 5, the insulating resistance became as small as $3.5 \times 10^6 \Omega$ after the high temperature bias test, the multi-layer wiring substrate in Comparative Example 5 was found to be inferior in thermal resistance. Further, from Table 6, since, in the multi-layer wiring substrate in Comparative Example 6, a wiring failure was generated in the temperature cycle test, the multi-layer wiring substrate in Comparative Example 6 was found to be inferior in the insulating property and the temperature cycle property. Furthermore, from Table 7, since, in the multi-layer wiring substrate of Comparative Example 6, the transmission characteristics were deteriorated as being −1.0 dB or less in the high frequency region of 20 GHz or more, the multi-layer wiring substrate in Comparative Example 6 was found to be inferior in the high-frequency transmission characteristics.

On the other hand, the multi-layer wiring substrate according to the invention was excellent in that the insulating resistance was as large as 4.3×10$^{10}$Ω even after the high temperature bias test, the rate of change of the conductive resistance was as small as 4% even after the temperature cycle test and the transmission characteristics were as small as −0. 51 dB even in the high frequency region of 40 GHz.

Fifth Embodiment

Figure 9:
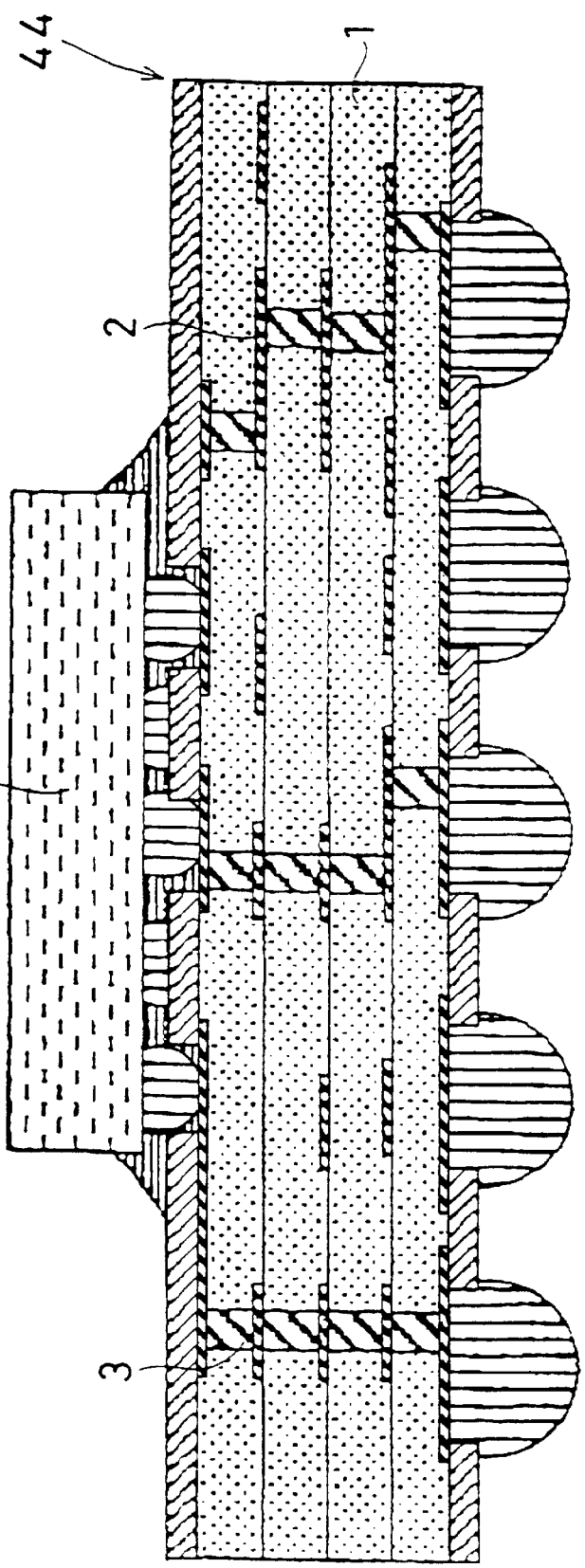
FIG. 9 is a cross-sectional view of a mixed integrated circuit comprising a semiconductor device mounted on a multi-layer wiring substrate according to a fifth embodiment of the invention.
Figure 10:
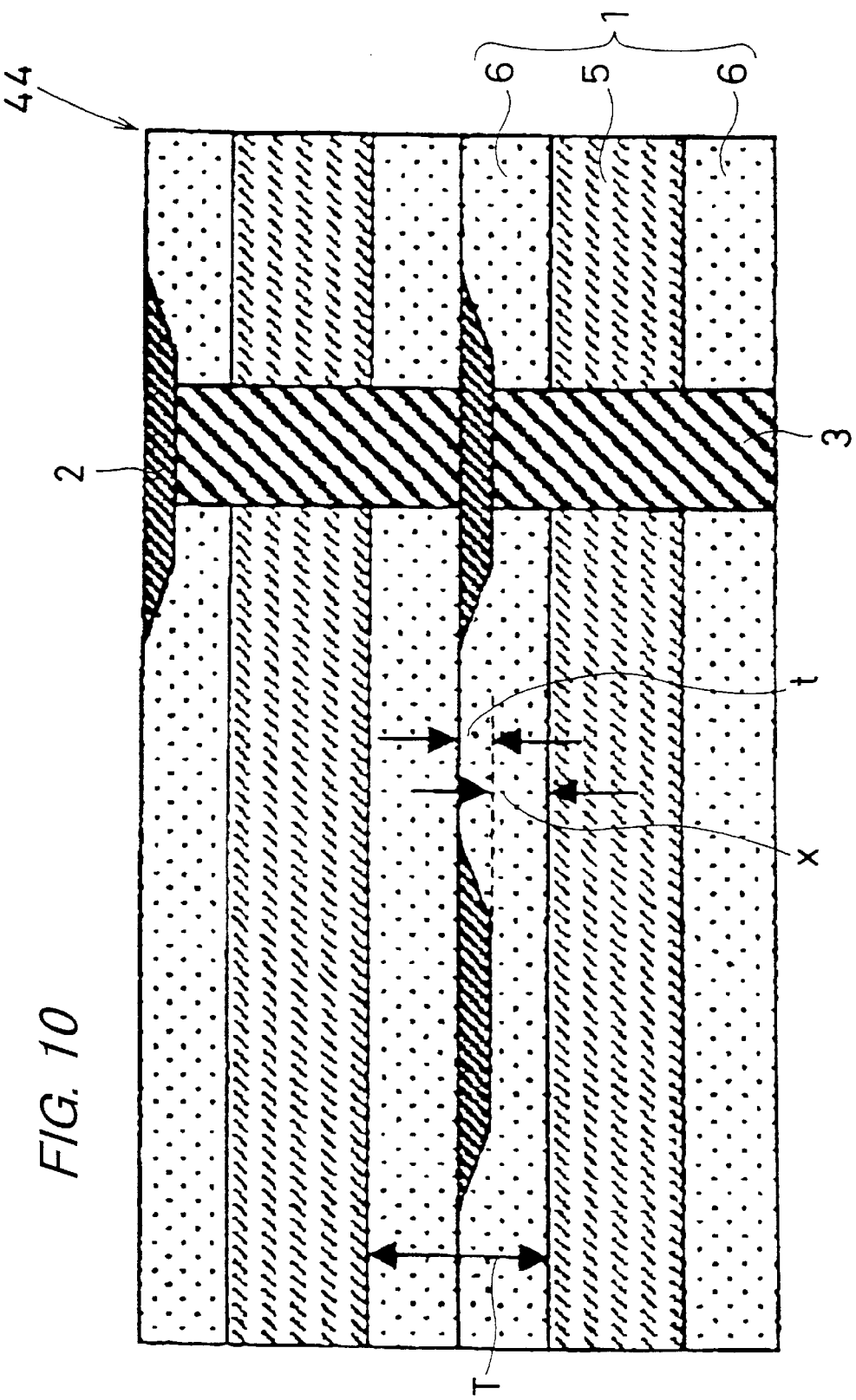
FIG. 10 is an enlarged cross-sectional view of a substantial portion of the multi-layer wiring substrate shown in FIG. 9.
Figure 11:
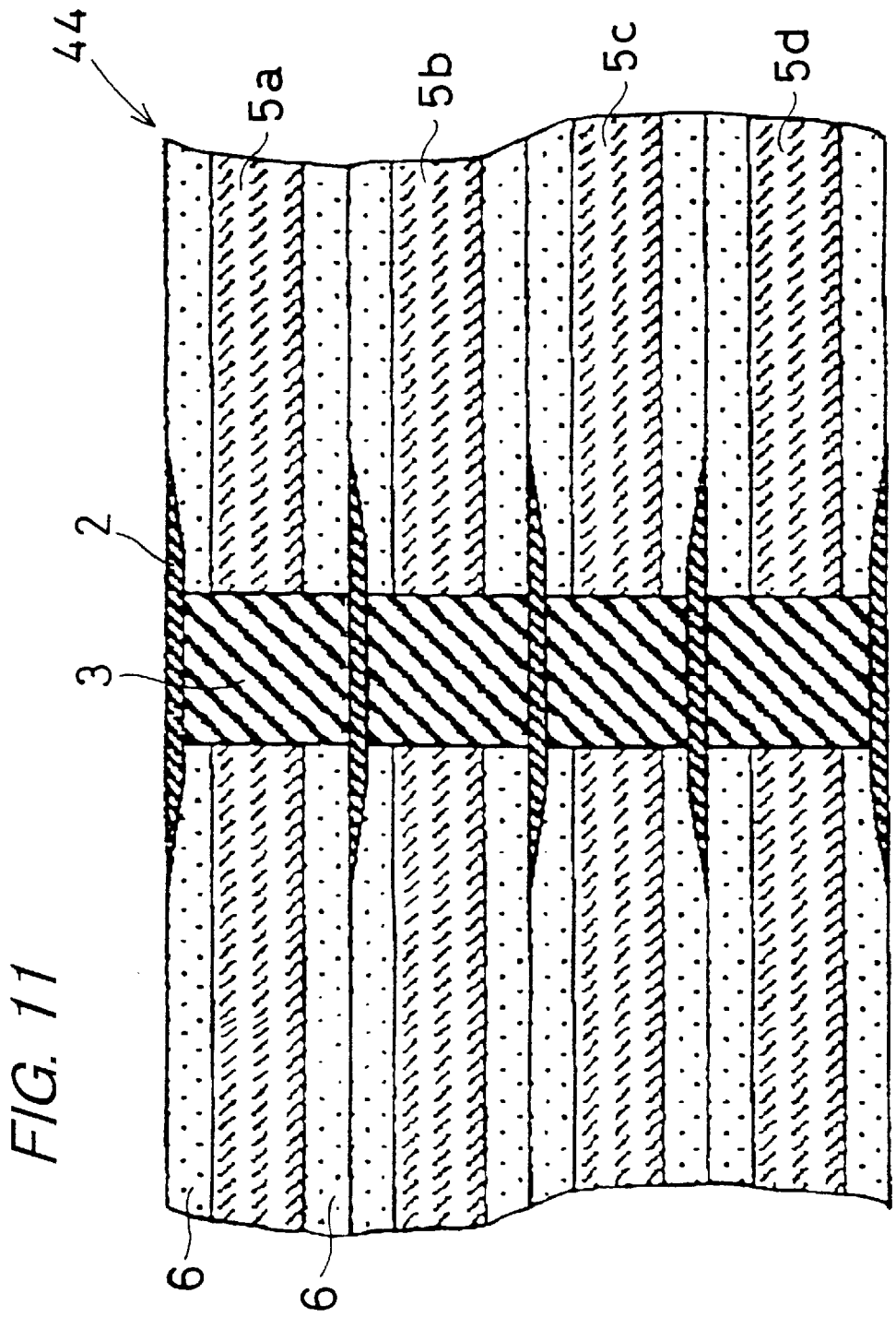
FIG. 11 is a cross-sectional view of a substantial portion of the multi-layer wiring substrate shown in FIG. 9.

FIG. 9 is a cross-sectional view of a mixed integrated circuit comprising a semiconductor device mounted on a multi-layer wiring substrate according to a fifth embodiment of the present invention, FIG. 10 is an enlarged cross-sectional view of a substantial portion of the multi-layer wiring substrate shown in FIG. 9, and FIG. 11 is an enlarged cross-sectional view of the multi-layer wiring substrate shown in FIG. 9. In this embodiment, parts corresponding to the above-mentioned embodiment are denoted same numerals and explanations with respect to them are omitted. In these figures, reference numerals 1, 2 and 3 denote a dielectric layer, a wiring conductor and a through conductor, respectively and a multi-layer wiring substrate 44 according to the invention is primarily constructed by these portions. Further, in the present embodiment, the multi-layer wiring substrate 44 comprising 4 layers of the dielectric layers 11 laminated with one another is shown for an illustrative purpose only and by no means for limiting it.

The dielectric layer 1, which comprises a liquid crystal polymer layer 5a–5d (generally, liquid crystal polymer layer 5) and a cladding layer 6 adhere-formed thereon comprising a polyphenyleneether-type organic substance, functions as a support for an electronic component 7 mounted on the multi-layer wiring substrate 44 and the wiring conductor 2.

In the multi-layer wiring substrate 44 according to the present invention, the liquid crystal polymer layer 5 has an anisotropic dielectric property in which the dielectric constant becomes maximum in one direction of directions parallel to a plane of the liquid crystal polymer layer, and it is important that a degree of the anisotropic dielectric property is set to be from 1.2 to 2.0. Further, as herein used, the nomenclature "degree of anisotropic dielectric property" is a value represented by a ratio $\in_x/\in_y$ of a dielectric constant $\in_x$ in a direction in which the dielectric constant becomes maximum among directions parallel to the plane of the liquid crystal polymer layer 5 to a dielectric constant $\in_y$ in a direction orthogonal to the direction in which the dielectric constant becomes maximum among directions parallel to the plane of the liquid crystal polymer layer 5 whereupon the value expresses an alignment state of molecules of the liquid crystal polymer in the liquid crystal polymer layer 5.

In the liquid crystal polymer layer 5, the degree of anisotropic dielectric property is set to be from 1.2 to 2.0, molecules of the liquid crystal polymer are regularly aligned to some extent to enhance an intermolecular force, coefficient of thermal expansion of the liquid crystal polymer layer 5 can be decreased to a degree similar to that of a metal to be ordinarily used in the wiring conductor such as copper and, as a result, it becomes feasible to form the multi-layer wiring substrate 44 in which a wiring failure does not occur at a joint between the through conductor 3 and the wiring conductor 2 by the temperature cycle test.

In the liquid crystal polymer layer 5, when the degree of the anisotropic dielectric property is less than 1.2, a structure in which molecules are regularly aligned with each other is corrupted, intermolecular force between the liquid crystal polymer molecules becomes weak and the coefficient of thermal expansion becomes large whereupon there is a tendency in which wiring failure is likely to be generated at a joint between the through conductor 3 and the wiring conductor 2. Further, when the degree of the anisotropic dielectric property is more than 2.0, the liquid crystal polymer layer 5 becomes excessively rigid whereupon there is a tendency in which a property of providing a hole by a drilling operation at the time of forming the through hole 3 by a laser or a roughening property at the time of roughening the surface is deteriorated. Therefore, it is preferable that the degree of the anisotropic dielectric property of the liquid crystal polymer layer 5 is set to be in a range of from 1.2 to 2.0.

Such liquid crystal polymer layer 5 is formed by a known T-die method or an inflation method; on this occasion, by adjusting an extension rate of a vertical direction to a horizontal direction of the layer at the time of forming, molecules of the liquid crystal polymer are oriented to a forming direction of the liquid crystal polymer layer 5 whereupon the degree of the anisotropic property thereof can be set in a range of from 1.2 to 2.0.

According to the multi-layer wiring substrate 44 of the invention, since the dielectric constants of the liquid crystal polymer layer 5 and the cladding layer 6 comprising polyphenyleneether-type organic substance are approximately same with each other, even when a minor variation in thickness is generated at the time of lamination, the multi-layer wiring substrate 44 excellent in the high-frequency transmission characteristics which does not deteriorate the transmission characteristics in a high frequency region can be formed. Further, since the cladding layer 6 exhibits a similar hydrophobic property to that of the liquid crystal polymer layer 5, affinity between resins themselves is favorable and adhesiveness therebetween is excellent and, further, since a molecular structure of the cladding layer 6 is random and of a relatively easily movable, when the wiring conductor 2 is provided on the surface of the dielectric layer 1, the molecules constituting the cladding layer 6 enter into a fine dent formed on a surface of the wiring conductor 2 whereupon a sufficient anchor effect can be executed and, as a result, the adhesiveness between the wiring conductor 2 and the cladding layer 6 is enhanced whereupon the multi-layer wiring substrate 44 which does not generate an insulating failure by the high temperature bias test and is excellent in thermal resistance and an insulating property can be formed.

Figure 12B:
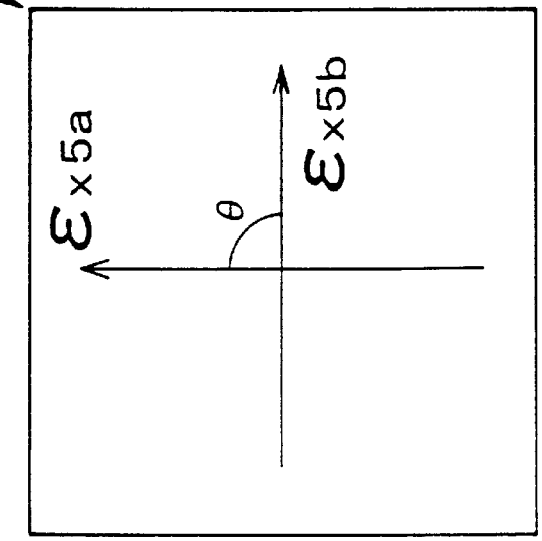
FIGS. 12A and 12B are top views of liquid crystal polymer layers 5a and 5b, respectively.
Figure 12A:
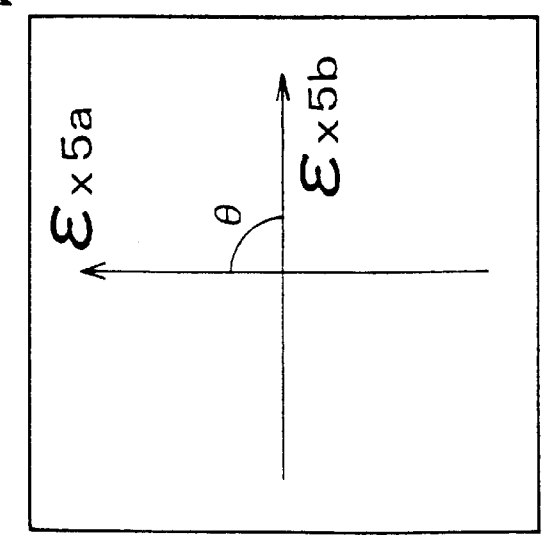

In the multi-layer wiring substrate 44 according to the invention, it is preferable that each dielectric layer 1 and another dielectric layer 1 adjacent to the former dielectric layer 1 are laminated, for example, as shown in FIG. 12A of a top plan view of the liquid crystal polymer layer 5a which is shown in FIG. 11 of a cross-sectional view of the multi-layer wiring substrate 44 and in FIG. 12B of a top plan view of the liquid crystal polymer layer 5b which is shown in FIG. 11 of a cross-sectional view of the multi-layer wiring substrate 44, such that an angle θ formed with directions $\in_{x5a}$ and $\in_{x5b}$ in which dielectric constants of the liquid crystal polymer layers 5a and 5b constituting respective dielectric layers 1 described above become maximum is from 50° to 130°. Since each dielectric layer 1 has a characteristic that the liquid crystal polymer molecules are regularly aligned in a direction in which the dielectric constant becomes maximum whereupon a flexural strength Is enhanced, when each dielectric layer 1 and another dielectric layer 1 adjacent to the former dielectric layer 1 are laminated with each other such that the angle θ formed with directions $\in_{x5a}$ and $\in_{x5b}$ in which the dielectric constant of each dielectric layer 1 becomes maximum is from 50° to 130°, the thus-enhanced flexural strength in each of longitudinal and transverse directions of the multi-layer wiring substrate 44 can be exhibited and, as a result, even when the multi-layer wiring substrate 44 is formed to be thinner than before, the multi-layer wiring substrate 44 which does not generate a camber therein can be formed.

Further, when the angle θ formed by the directions $\in_{X5a}$ and $\in_{X5b}$ in which the respective dielectric constants of each dielectric layer 1 and another dielectric layer 1 adjacent to the former dielectric layer 1 become maximum is less than 50° or more than 130°, a large difference of the flexural strength between the longitudinal and transverse directions of the multi-layer wiring substrate 44 is generated whereupon there is a tendency in which, when the multi-layer wiring substrate 44 is formed to be thinner than before, a camber is generated therein. Therefore, it is preferable that the angle θ formed by the directions $\in_{X5a}$ and $\in_{X5b}$ in which the respective dielectric constants of each dielectric layer 1 and another dielectric layer 1 adjacent to the former dielectric layer 1 become maximum is in a range of from 50° to 130° and, preferably, from 60° to 120°.

Thus, according to the multi-layer wiring substrate 44 of the invention, since the dielectric layer 1 has the cladding layer 6 comprising polyphenyleneether-type organic substance formed on the surface of the liquid crystal polymer layer 5 and, further, a degree of the anisotropic dielectric property represented by a ratio $\in_X/\in_Y$ of a dielectric constant $\in_X$ in a direction in which the dielectric constant becomes maximum among directions parallel to the plane of the liquid crystal polymer layer 5 to a dielectric constant $\in_Y$ in a direction orthogonal to the direction in which the dielectric constant becomes maximum among directions parallel to the plane of the liquid crystal polymer layer 5 is set to be from 1.2 to 2.0, the multi-layer wiring substrate 44 which has a high-density wiring and is excellent in soldering resistance, temperature cycle resistance, an insulating property, high transmission characteristics and an anti-camber property can be formed.

The liquid crystal polymer layer 5 used in the present embodiment may be used in any one of the first, second and third embodiments in place of the liquid crystal polymer layer 5 used therein.

A multi-layer wiring substrate according to the fifth embodiment of the invention was evaluated by means of a sample fabricated in a manner as described below.

EXAMPLE 4

First, spherical fused silica having an average particle diameter of 0.6 μm was added to a thermosetting-type polyphenyleneether resin such that a content thereof becomes 40% by volume to produce a mixture and, then, toluene as a solvent and a catalyst for acceleration of setting of the organic resin were added to the thus-prepared mixture and agitated for one hour to prepare a varnish. Subsequently, a liquid crystal polymer layer having a degree of an anisotropic dielectric property of 1.4, a melting point of 350° C., a thickness of 35 μm and having a surface which had been subjected to plasma processing to have a center line average roughness Ra of 0.10 μm was prepared and, then, the thus-prepared varnish was coated on an upper surface of the thus-prepared liquid crystal polymer layer by a doctor blade method to form a cladding layer comprising a thermosetting-type polyphenyleneether having a thickness of about 20 μm in a dry state. Subsequently, another cladding layer comprising the polyphenyleneether was also formed on a bottom surface of the liquid crystal polymer layer in a same manner as described above to fabricate a precursor sheet which will eventually become a dielectric layer. Thereafter, a through hole having a diameter of 65 μm was formed in this precursor sheet by using a $CO_2$ laser and, further, a conductive paste containing copper powders and an organic binder was embedded in this through hole by a screen printing method to form a through conductor.

Next, after a transfer support film attached with a copper foil having a thickness of 12 μm which had been formed in a circuit pattern and the precursor sheet comprising the through conductor formed therein which will eventually becomes a dielectric layer were stacked while being positioned in registry with each other and applied with a pressure of 3 MPa for 30 seconds in a vacuumized laminating apparatus to allow them to be laminated and, thereafter, the transfer support film was removed therefrom to embed the wiring conductor in the precursor sheet which will eventually become the dielectric layer. Lastly, 4 sheets made up of precursor sheets on which this wiring conductor was formed and other precursor sheets each adjacent to the former precursor sheet were stacked with one another such that directions of the former and latter precursor sheets in which the dielectric constants thereof become maximum are orthogonal to each other, subjected to heating processing at a temperature of 200° C. under a pressure of 3 MPa for 5 hours for securing a complete setting to obtain the multi-layer wiring substrate.

Further, as for a test substrate for an evaluation of the insulating property, a wiring conductor in a pectinate pattern having a wiring width of 50 μm and a wiring space of 50 μm was formed in the test substrate, whereas, as for a test substance for an evaluation of a conductive property, formed therein was a viachain by 2 layers of the wiring conductors which are positioned above and below the dielectric layer of the multi-layer wiring substrate, respectively, and a through conductor which electrically connects the 2 layers of the wiring conductors.

Comparative Example 7

A multi-layer wiring substrate for use in Comparative Example 7 was fabricated by firstly forming a wiring conductor in a circuit pattern on a liquid crystal polymer layer having a copper foil heat-fused on a surface thereof and having a degree of an anisotropic property of 1.05 and a melting point of 320° C. by using photoresist and, then, forming a through hole having a diameter of 65 μm by using a $CO_2$ laser and, further, forming a through conductor by embedding a conductive paste containing copper powders and an organic binder in the thus-formed through hole by screen printing thereby forming a circuit substrate and, thereafter, laminating the thus-formed circuit substrate in 4 layers and, lastly, heat-pressing the resultant laminate at a temperature of 285° C. under a pressure of 1 MPa for 5 minutes.

As for the evaluation of the insulating property, a high temperature bias test was executed under conditions of a temperature of 130° C., relative humidity of 85% and applied potential of 5.5 V, insulating resistance between wiring conductors themselves after 168 hours was measured and a variation of insulating resistance between before and after the test was examined thereby evaluating the insulating property. Further, as for the evaluation of the conductive property, a sample was subjected to the temperature cycle test in which one cycle was set as being −55° C. for 30 minutes plus 125° C. for 30 minutes, the conductive resistance of the viachain after 1000 cycles was measured and a variation of the conductive resistance between before and after the test was examined to evaluate the insulating property.

Evaluation results of the insulating property and the conductive property are shown in Tables 8 and 9, respectively.

TABLE 8

| Sample | Insulating resistance/Ω | |
|---|---|---|
| | Before test | After high temperature bias test |
| Example 4 | $8.9 \times 10^{12}$ | $2.8 \times 10^{10}$ |
| Comparative Example 7 | $8.2 \times 10^{12}$ | $3.3 \times 10^{5}$ |

TABLE 9

| Sample | Conductive resistance/Ω | |
|---|---|---|
| | Before test | After temperature cycle test |
| Example 4 | 7.5 | 7.8 (conversion 4%) |
| Comparative Example 7 | 8.6 | wiring failure |

From Table 8, since the insulating resistance after the high temperature bias test becomes as extremely small as $3.3 \times 10^{5} \Omega$, the multi-layer wiring substrate of Comparative Example was found to be inferior in thermal resistance. Further, from Table 9, since wiring failure was generated in the multi-layer wiring substrate by the temperature cycle test, the multi-layer wiring substrate of Comparative Example was found to be inferior in the insulating property and the temperature cycle property.

On the other hand, the multi-layer wiring substrate according to the invention was a multi-layer wiring substrate which is excellent in reliability such that the insulating resistance was as large as $2.8 \times 10^{10} \Omega$ even after the high temperature bias test and the rate of change of the conductive property was as small as 4% even after the temperature cycle test.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A multi-layer wiring substrate comprising:
a lamination of a plurality of dielectric layers which each comprise an organic material and are each provided with a wiring conductor of a metallic foil on at least one surface of upper and bottom surfaces of the respective dielectric layers, the wiring conductors between which the dielectric layer is disposed being electrically connected with each other via a through conductor formed in the dielectric layer, wherein the dielectric layers each individually are composed of a liquid crystal polymer layer and cladding layers comprising a polyphenyleneether-type organic substance, formed on upper and bottom surfaces of the liquid crystal polymer layer.

2. The multi-layer wiring substrate of claim 1, further comprising triallyl isocyanurate in the cladding layers wherein a contact angle which indicates a wetting property of the triallyl isocyanurate to a surface of the liquid crystal polymer layer is from 3° to 50°, the wetting property of triallyl isocyanurate and that of polyphenyleneether-type organic substance being approximate to each other.

3. The multi-layer wiring substrate of claim 2, wherein the wiring conductor is embedded in the cladding layer and a cross-sectional shape of the wiring conductor in a width direction of the wiring substrate is a trapezoid in which a first base of the wiring conductor on an embedded side is shorter in length than a second base opposite to the first base and also an angle established between the first base and a side of the wiring conductor that connects the first base to the second base is from 95° to 150°.

4. The multi-layer wiring substrate of claim 3, wherein among sub-layers constituting the dielectric layer, a thickness x ($\mu$m) of the cladding layer positioned between the shorter first base of the wiring conductor and the closest liquid crystal polymer layer meets the following expression:

$$3\ \mu m \leq 0.5T - t \leq x \leq 0.5T \leq 35\ \mu m \text{ (under the conditions of 8} \\ \mu m \leq T \leq 70\ \mu m, \text{ and } 1\ \mu m \leq t \leq 32\ \mu m),$$

wherein T is a distance ($\mu$m) between the liquid crystal polymer layers, and t is a thickness ($\mu$m) of the wiring conductor, respectively.

5. The multi-layer wiring substrate of claim 1, wherein the wiring conductor is embedded in the cladding layer and a cross-sectional shape of the wiring conductor in a width direction of the wiring substrate is a trapezoid in which a first base of the wiring conductor on an embedded side is shorter in length than a second base opposite to the first base and also an angle established between the first base and a side of the wiring conductor that connects the first base to the second base is from 95° to 150°.

6. The multi-layer wiring substrate of claim 5, wherein among sub-layers constituting the dielectric layer, a thickness x ($\mu$m) of the cladding layer positioned between the shorter first base of the wiring conductor and the closest liquid crystal polymer layer meets the following expression:

$$3\ \mu m \leq 0.5T - t \leq x \leq 0.5T \leq 35\ \mu m \text{ (under the conditions of 8} \\ \mu m \leq T \leq 70\ \mu m, \text{ and } 1\ \mu m \leq t \leq 32\ \mu m),$$

wherein T is a distance ($\mu$m) between the liquid crystal polymer layers, and t is a thickness ($\mu$m) of the wiring conductor, respectively.

7. The multi-layer wiring substrate of claim 1, wherein the liquid crystal polymer layer has an anisotropic dielectric property in which the dielectric constant becomes maximum in one direction of directions parallel to a plane of the liquid crystal polymer layer, and a degree of the anisotropic dielectric property represented by a ratio $\in_x/\in_y$ is from 1.2 to 2.0, wherein $\in_x$ is a dielectric constant in a direction in which the dielectric constant becomes maximum among directions parallel to the plane of the liquid crystal polymer layer, and $\in_y$ is a dielectric constant in a direction orthogonal to the direction in which the dielectric constant becomes maximum among directions parallel to the plane of the liquid crystal polymer layer.

8. A multi-layer wiring substrate comprising:
a lamination of a plurality of dielectric layers which each comprise an organic material and are each provided with a wiring conductor of a metallic foil on at least one surface of upper and bottom surfaces of the respective dielectric layers, the wiring conductors between which the dielectric layer is disposed being electrically connected with each other via a through conductor formed in the dielectric layer, wherein the dielectric layers each individually are composed of a liquid crystal polymer layer and cladding layers which are formed by laminating a first layer in which from 60% by volume to 80% by volume of inorganic insulating fillers are contained in a polyphenyleneether-type organic substance, a second layer in which from 40% by volume to 60% by volume of inorganic insulating fillers are contained in polyphenyleneether-type organic substance and a third layer in which from 20% by volume to 40% by volume of inorganic insulating fillers are contained in the polyphenyleneether-type organic substance in this order on each of upper and bottom surfaces of the liquid crystal polymer layer.

9. The multi-layer wiring substrate of claim 8, further comprising triallyl isocyanurate in the cladding layers wherein a contact angle which indicates a wetting property of the triallyl isocyanurate to a surface of the liquid crystal polymer layer is from 3° to 50°, the wetting property of triallyl isocyanurate and that of polyphenyleneether-type organic substance being approximate to each other.

10. The multi-layer wiring substrate of claim 9, wherein the wiring conductor is embedded in the cladding layer and a cross-sectional shape of the wiring conductor in a width direction of the wiring substrate is a trapezoid in which a first base of the wiring conductor on an embedded side is shorter in length than a second base opposite to the first base and also an angle established between the first base and a side of the wiring conductor that connects the first base to the second base is from 95° to 150°.

11. The multi-layer wiring substrate of claim 10, wherein among sub-layers constituting the dielectric layer, a thickness x ($\mu$m) of the cladding layer positioned between the shorter first base of the wiring conductor and the closest liquid crystal polymer layer meets the following expression:

$$3 \ \mu m \leq 0.5T - t \leq x \leq 0.5T \leq 35 \ \mu m \text{ (under the conditions of } 8 \ \mu m \leq T \leq 70 \ \mu m, \text{ and } 1 \ \mu m \leq t \leq 32 \ \mu m),$$

wherein T is a distance ($\mu$m) between the liquid crystal polymer layers, and t is a thickness ($\mu$m) of the wiring conductor, respectively.

12. The multi-layer wiring substrate of claim 8, wherein the wiring conductor is embedded in the cladding layer and a cross-sectional shape of the wiring conductor in a width direction of the wiring substrate is a trapezoid in which a first base of the wiring conductor on an embedded side is shorter in length than a second base opposite to the first base and also an angle established between the first base and a side of the wiring conductor that connects the first base to the second base is from 95° to 150°.

13. The multi-layer wiring substrate of claim 12, wherein among sub-layers constituting the dielectric layer, a thickness x ($\mu$m) of the cladding layer positioned between the shorter first base of the wiring conductor and the closest liquid crystal polymer layer meets the following expression:

$$3 \ \mu m \leq 0.5T - t \leq x \leq 0.5T \leq 35 \ \mu m \text{ (under the conditions of } 8 \ \mu m \leq T \leq 70 \ \mu m, \text{ and } 1 \ \mu m \leq t \leq 32 \ \mu m),$$

wherein T is a distance ($\mu$m) between the liquid crystal polymer layers, and t is a thickness ($\mu$m) of the wiring conductor, respectively.

14. A multi-layer wiring substrate comprising:

a lamination of a plurality of dielectric layers which each comprise an organic material and are each provided with a wiring conductor of a metallic foil on at least one surface of upper and bottom surfaces of the respective dielectric layers, the wiring conductors between which the dielectric layer is disposed being electrically connected with each other via a through conductor formed in the dielectric layer, wherein the dielectric layers each individually are composed of a liquid crystal polymer layer and cladding layers each comprising a polyphenyleneether-type organic substance and another organic substance having a lower Young's modulus than that of the former organic substance formed on upper and bottom surfaces of the liquid crystal polymer layer, and wherein, in the liquid crystal polymer layer, coefficient of thermal expansion thereof in a longitudinal direction is from −20 ppm/° C. to 20 ppm/° C. and Young's modulus thereof is 2 GPa or more and, in the cladding layer, the Young's modulus in a longitudinal direction is from 0.2 GPa to 1.5 GPa.

15. The multi-layer wiring substrate of claim 14, further comprising triallyl isocyanurate in the cladding layers wherein a contact angle which indicates a wetting property of the triallyl isocyanurate to a surface of the liquid crystal polymer layer is from 3° to 50°, the wetting property of triallyl isocyanurate and that of polyphenyleneether-type organic substance being approximate to each other.

16. The multi-layer wiring substrate of claim 15, wherein the wiring conductor is embedded in the cladding layer and a cross-sectional shape of the wiring conductor in a width direction of the wiring substrate is a trapezoid in which a first base of the wiring conductor on an embedded side is shorter in length than a second base opposite to the first base and also an angle established between the first base and a side of the wiring conductor that connects the first base to the second base is from 95° to 150°.

17. The multi-layer wiring substrate of claim 16, wherein among sub-layers constituting the dielectric layer, a thickness x ($\mu$m) of the cladding layer positioned between the shorter first base of the wiring conductor and the closest liquid crystal polymer layer meets the following expression:

$$3 \ \mu m \leq 0.5T - t \leq x \leq 0.5T \leq 35 \ \mu m \text{ (under the conditions of } 8 \ \mu m \leq T \leq 70 \ \mu m, \text{ and } 1 \ \mu m \leq t \leq 32 \ \mu m),$$

wherein T is a distance ($\mu$m) between the liquid crystal polymer layers, and t is a thickness ($\mu$m) of the wiring conductor, respectively.

18. The multi-layer wiring substrate of claim 14, wherein the wiring conductor is embedded in the cladding layer and a cross-sectional shape of the wiring conductor in a width direction of the wiring substrate is a trapezoid in which a first base of the wiring conductor on an embedded side is shorter in length than a second base opposite to the first base and also an angle established between the first base and a side of the wiring conductor that connects the first base to the second base is from 95° to 150°.

19. The multi-layer wiring substrate of claim 18, wherein among sub-layers constituting the dielectric layer, a thickness x ($\mu$m) of the cladding layer positioned between the shorter first base of the wiring conductor and the closest liquid crystal polymer layer meets the following expression:

$$3 \ \mu m \leq 0.5T - t \leq x \leq 0.5T \leq 35 \ \mu m \text{ (under the conditions of } 8 \ \mu m \leq T \leq 70 \ \mu m, \text{ and } 1 \ \mu m \leq t \leq 32 \ \mu m),$$

wherein T is a distance ($\mu$m) between the liquid crystal polymer layers, and t is a thickness ($\mu$m) of the wiring conductor, respectively.

20. The multi-layer wiring substrate of claim 14, wherein the liquid crystal polymer layer has an anisotropic dielectric property in which the dielectric constant becomes maximum in one direction of directions parallel to a plane of the liquid crystal polymer layer, and a degree of the anisotropic dielectric property represented by a ratio $\epsilon_x/\epsilon_y$ is from 1.2 to 2.0, wherein $\epsilon_x$ is a dielectric constant in a direction in which the dielectric constant becomes maximum among directions parallel to the plane of the liquid crystal polymer layer, and $\epsilon_y$ is a dielectric constant in a direction orthogonal to the direction in which the dielectric constant becomes maximum among directions parallel to the plane of the liquid crystal polymer layer.

* * * * *